United States Patent
Wu et al.

(10) Patent No.: US 10,972,099 B2
(45) Date of Patent: Apr. 6, 2021

(54) TOUCH KEYBOARD HAVING LOW NOISE INTERFERENCE

(71) Applicant: PixArt Imaging Inc., Hsin-Chu County (TW)

(72) Inventors: Sung-Han Wu, Hsin-Chu County (TW); Che-Chia Hsu, Hsin-Chu County (TW); Chia-Yi Lee, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

(21) Appl. No.: 16/744,580

(22) Filed: Jan. 16, 2020

(65) Prior Publication Data

US 2020/0153432 A1  May 14, 2020

Related U.S. Application Data

(63) Continuation-in-part of application No. 15/409,035, filed on Jan. 18, 2017, and a continuation-in-part of application No. 15/355,266, filed on Nov. 18, 2016, now Pat. No. 10,775,939.

(30) Foreign Application Priority Data

Mar. 10, 2016 (TW) .................................. 105107343
Jun. 21, 2016 (TW) .................................. 105119443

(51) Int. Cl.
*H03K 17/96* (2006.01)
*H03K 17/98* (2006.01)

(52) U.S. Cl.
CPC ......... *H03K 17/9622* (2013.01); *H03K 17/98* (2013.01); *H03K 2017/9613* (2013.01); *H03K 2217/960745* (2013.01)

(58) Field of Classification Search
None
See application file for complete search history.

(56) References Cited

U.S. PATENT DOCUMENTS

| | | | | |
|---|---|---|---|---|
| 2009/0128511 A1* | 5/2009 | Sinclair | .................... | G06F 3/044 345/174 |
| 2014/0327644 A1* | 11/2014 | Mohindra | ............. | G06F 3/0416 345/174 |
| 2015/0301651 A1* | 10/2015 | Leigh | .................... | G06F 3/0446 345/174 |
| 2015/0331535 A1* | 11/2015 | Li | ........................ | G06F 3/0446 348/174 |

* cited by examiner

*Primary Examiner* — Amare Mengistu
*Assistant Examiner* — Sarvesh J Nadkarni
(74) *Attorney, Agent, or Firm* — Hauptman Ham, LLP

(57) ABSTRACT

A capacitive touch system including a drive end, a capacitive touch sensing device and a detection end is provided. The drive end inputs a modulated drive signal into an input channel of the capacitive sensing device, wherein the modulated drive signal includes a plurality of driving frequencies. The detection end detects a detection signal of an output channel of the capacitive sensing device and generates a two-dimensional detection vector corresponding to each of the driving frequencies. The capacitive touch system includes a touch panel or a touch keyboard.

19 Claims, 15 Drawing Sheets

| drive signals | k=1 | k=2 | ..... | k=n |
|---|---|---|---|---|
| $X_1(t_k)$ | $X(t)a_{11}x_1$ | $X(t)a_{21}x_1$ | | $X(t)a_{n1}x_1$ |
| $X_2(t_k)$ | $X(t)a_{12}x_2$ | $X(t)a_{22}x_2$ | | $X(t)a_{n2}x_2$ |
| . | . | . | ..... | . |
| . | . | . | | . |
| $X_n(t_k)$ | $X(t)a_{1n}x_n$ | $X(t)a_{2n}x_n$ | | $X(t)a_{nn}x_n$ |

FDM

OFDM

TOUCH KEYBOARD HAVING LOW NOISE INTERFERENCE

RELATED APPLICATIONS

The present application is a continuation-in-part application of U.S. patent application Ser. No. 15/355,266 filed on, Nov. 18, 2016, which is based on and claims priority to Taiwanese Application Number 105107343, filed Mar. 10, 2016, the disclosures of which are hereby incorporated by reference herein in their entirety. The present application is also a continuation-in-part application of U.S. patent application Ser. No. 15/409,035 filed on, Jan. 18, 2017, which claims the priority benefit of Taiwan Patent Application Serial Number 105119443, filed on Jun. 21, 2016, the disclosures of which are hereby incorporated by reference herein in their entirety.

BACKGROUND

1. Field of the Disclosure

This disclosure generally relates to a touch system and, more particularly, to a capacitive touch system using frequency division multiplexing and an operating method thereof, wherein the capacitive touch system includes a touch panel or a touch keyboard.

2. Description of the Related Art

Capacitive sensors generally include a pair of electrodes configured to sense a conductor. When the conductor is present, the amount of charge transfer between the pair of electrodes can be changed so that it is able to detect whether the conductor is present or not according to a voltage variation. It is able to form a sensing matrix by arranging a plurality of electrode pairs in a matrix.

FIGS. 1A and 1B are schematic diagrams of a conventional capacitive sensor which includes a first electrode 91, a second electrode 92, a drive circuit 93 and a detection circuit 94. The drive circuit 93 is configured to input a drive signal X to the first electrode 91. Electric field can be generated between the first electrode 91 and the second electrode 92 so as to transfer charges to the second electrode 92. The detection circuit 94 is configured to detect the amount of charge transfer Y to the second electrode 92. The electric field is represented by, for example, a capacitor.

When a conductor is present, e.g. shown by an equivalent circuit 8, the conductor can disturb the electric field between the first electrode 91 and the second electrode 92 so that the amount of charge transfer Y' is reduced. The detection circuit 94 can detect a voltage variation to accordingly identify the presence of the conductor.

As the capacitive sensor is generally applied to various electronic devices, e.g. the liquid crystal display (LCD), the voltage variation detected by the detection circuit 94 can be interfered by noises of the electronic devices to degrade the detection accuracy.

Accordingly, it is necessary to provide a way to solve the above problem.

SUMMARY

The present disclosure provides a capacitive touch system and an operating method thereof that input a mixed signal containing a plurality of driving frequencies into each input channel to achieve the objective of reducing the noise interference, power consumption and detection interval, wherein the mixing signal is generated by modulating a drive signal using, for example, frequency division multiplexing or orthogonal frequency division multiplexing, wherein the capacitive touch system includes a touch panel or a touch keyboard.

The present disclosure provides a touch keyboard including a drive circuit, multiple push buttons, an encoding module, a modulation module, a detection circuit and a decoding module. The drive circuit is configured to output a drive signal. The multiple push buttons are arranged in rows and columns, and each of the push buttons corresponds to one sensing element. The encoding module is configured to encode the drive signal corresponding to each row of the sensing elements to output a plurality of encoded drive signals. The modulation module is configured to modulate the encoded drive signals and concurrently output encoded and modulated drive signals to each row of the sensing elements, wherein each of the encoded and modulated drive signals contains a plurality of driving frequencies. The detection circuit is coupled to the sensing elements and configured to respectively generate a detection matrix corresponding to each of the driving frequencies according to a detection signal of each column of the sensing elements. The decoding module is configured to decode the detection matrices to output a plurality of two-dimensional detection vectors corresponding to each of the sensing elements, wherein the two-dimensional detection vectors associated with each of the sensing elements respectively correspond to the driving frequencies.

The present disclosure further provides a touch keyboard including a drive circuit, multiple push buttons, an encoding module, a modulation module, a detection circuit and a decoding module. The drive circuit is configured to output a drive signal. The multiple push buttons are arranged in rows and columns, and each of the push buttons corresponds to one sensing element. The encoding module is configured to encode the drive signal corresponding to each row of the sensing elements to output encoded drive signals. The modulation module is configured to modulate the encoded drive signals corresponding to each row of the sensing elements to concurrently output encoded and modulated drive signals to each row of the sensing elements. The detection circuit is coupled to the sensing elements and configured to respectively generate a detection matrix according to a detection signal of each column of the sensing elements. The decoding module is configured to decode the detection matrices to output a two-dimensional detection vector corresponding to each of the sensing elements.

The present disclosure further provides a touch keyboard including a drive circuit, multiple push buttons, an encoding module, a modulation module, a detection circuit and a decoding module. The drive circuit is configured to output a drive signal. The multiple push buttons are arranged in rows and columns, and each of the push buttons corresponds to one sensing element. The encoding module is configured to encode the drive signal corresponding to each row of the sensing elements to output a plurality of encoded drive signals. The modulation module is configured to modulate the encoded drive signals and concurrently output encoded and modulated drive signals to each row of the sensing elements, wherein each of the encoded and modulated drive signals contains a single driving frequency. The detection circuit is coupled to the sensing elements and configured to respectively generate a detection matrix according to a detection signal of each column of the sensing elements. The decoding module is configured to decode the detection matrices to output a two-dimensional detection vector corresponding to each of the sensing elements.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Figure 1A:
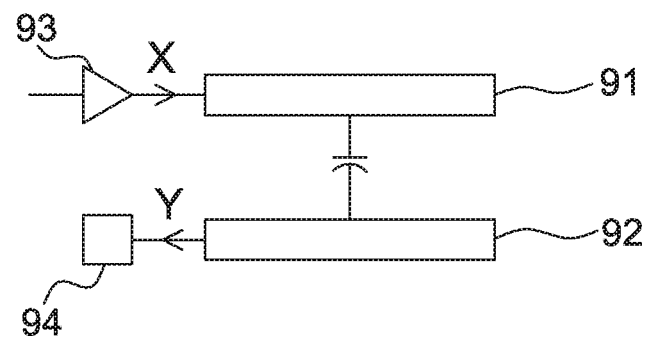
FIGS. 1A-1B are schematic diagrams of a conventional capacitive sensor.
Figure 1B:
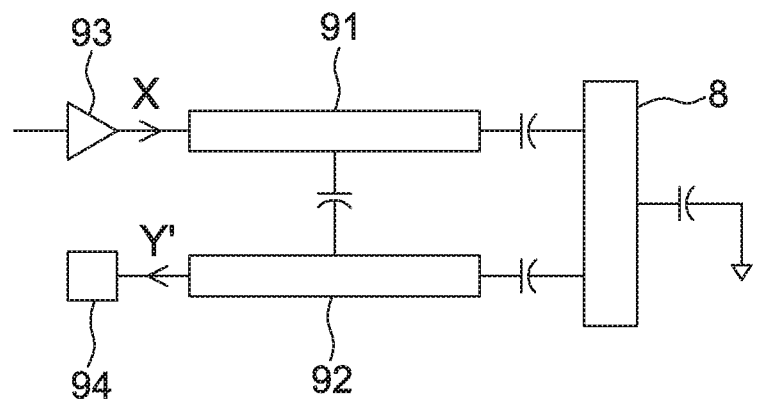
Figure 2:
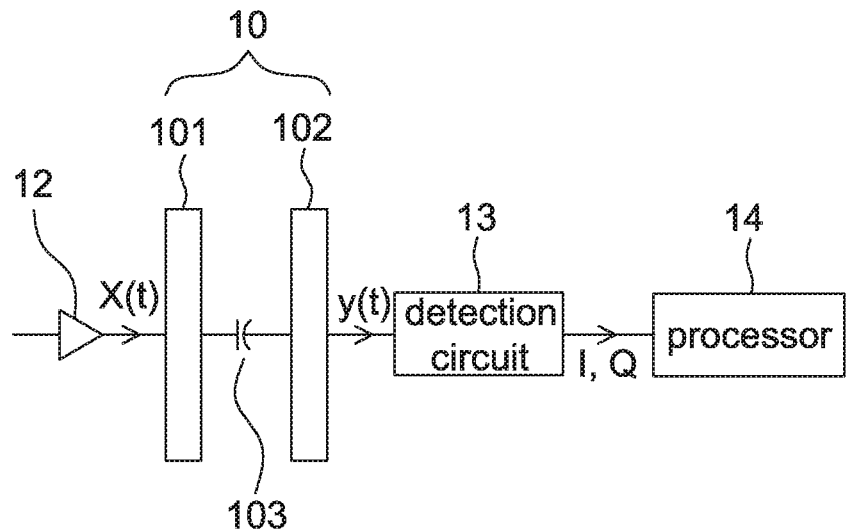
FIG. 2 is a schematic block diagram of a capacitive touch sensing device according to one embodiment of the present disclosure.

Referring to FIG. 2, it is a schematic block diagram of a capacitive touch sensing device according to one embodiment of the present disclosure. The capacitive touch sensing device of this embodiment includes a sensing element 10, a drive circuit 12, a detection circuit 13 and a processor 14. The capacitive touch sensing device is configured to detect whether an object (e.g. a finger, water drop or metal plate, but not limited to) approaches the sensing element 10 according to a change of the amount of charges on the sensing element 10. Ways to detect whether the object approaches the sensing element 10 are well known and not limited to the above method.

The sensing element 10 includes a first electrode 101 (e.g. a drive electrode) and a second electrode 102 (e.g. a receiving electrode), and an electric field can be produced to form a coupling capacitance 103 between the first electrode 101 and the second electrode 102 when a voltage signal is provided to the first electrode 101. The first electrode 101 and the second electrode 102 are arranged properly without particular limitations as long as the coupling capacitance 103 is formed (e.g., via a dielectric layer therebetween), wherein principles of forming the electric field and the coupling capacitance 103 between the first electrode 101 and the second electrode 102 are well known and thus are not described herein.

The drive circuit 12 is, for example, a signal generator which provides a drive signal X(t) to the first electrode 101 of the sensing element 10. The drive signal X(t) is, for example, a time-varying signal such as a periodic signal. In other embodiments, the drive signal X(t) is, for example, a pulse signal such as a square wave or a triangle wave, but not limited thereto. The drive signal X(t) couples a detection signal y(t) on the second electrode 102 of the sensing element 10 through the coupling capacitance 103.

The detection circuit 13 is coupled to the second electrode 102 of the sensing element 10 and configured to receive the detection signal y(t). The detection circuit 13 modulates (or mixes) the detection signal y(t) respectively with two mixing signals so as to generate a pair of modulated detection signals, which are configured as two components of a two-dimensional detection vector (I,Q) after the integration, downconversion and/or filtering. The two mixing signals are, for example, continuous signals or vectors that are orthogonal or non-orthogonal to each other. In one aspect, the two mixing signals include a sine signal and a cosine signal.

The processor 14 is configured to calculate a scale of the pair of modulated detection signals, which is configured as a norm of vector of the two-dimensional detection vector (I,Q), and compare the norm of vector with at least one threshold TH so as to identify a touch event. In one aspect, the processor 14 calculates the norm of vector $R=\sqrt{I^2+Q^2}$ by software. In other aspects, the processor 14 calculates by hardware or firmware, such as using a CORDIC (coordinate rotation digital computer) shown in FIG. 4 to obtain the norm of vector $R=\sqrt{I^2+Q^2}$, wherein the CORDIC is a fast algorithm. The processor 14 is, for example, a microprocessor (MCU), a central processing unit (CPU) or an application specific integrated circuit (ASIC).

Figure 4:
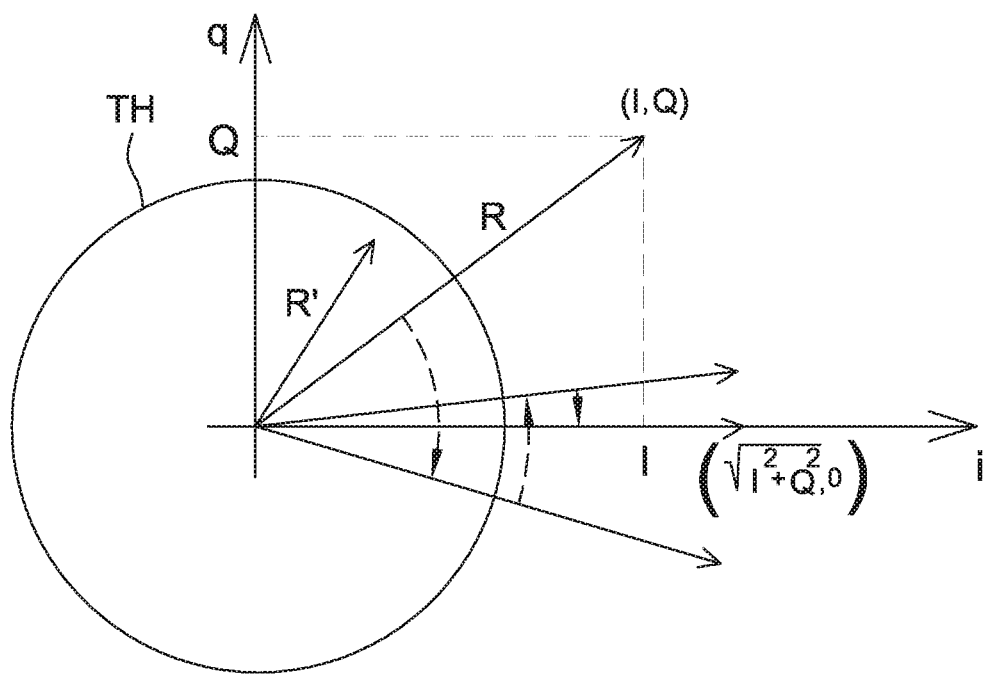
FIG. 4 is a schematic diagram of a norm of vector and a threshold according to one embodiment of the present disclosure.

In FIG. 4, when there is no object close to the sensing element 10, a norm of vector calculated by the processor 14 is assumed to be R; and when an object is present nearby the sensing element 10, the norm of vector is decreased to R'. When the norm of vector R' is smaller than a threshold TH, the processor 14 identifies that the object is present close to the sensing element 10 to induce a touch event. It should be mentioned that when another object, such as a metal plate, approaches the sensing element 10, the norm of vector R can be increased. Therefore, it is possible for the processor 14 to identify a touch event when the norm of vector exceeds another predetermined threshold. In some embodiments, the processor 14 compares a variation of the norm of vector (e.g., a difference value between the norm of vectors R' and R in FIG. 4) with a variation threshold to accordingly identify a touch event instead of comparing a value of the norm of vector with a predetermined threshold.

Figure 3A:
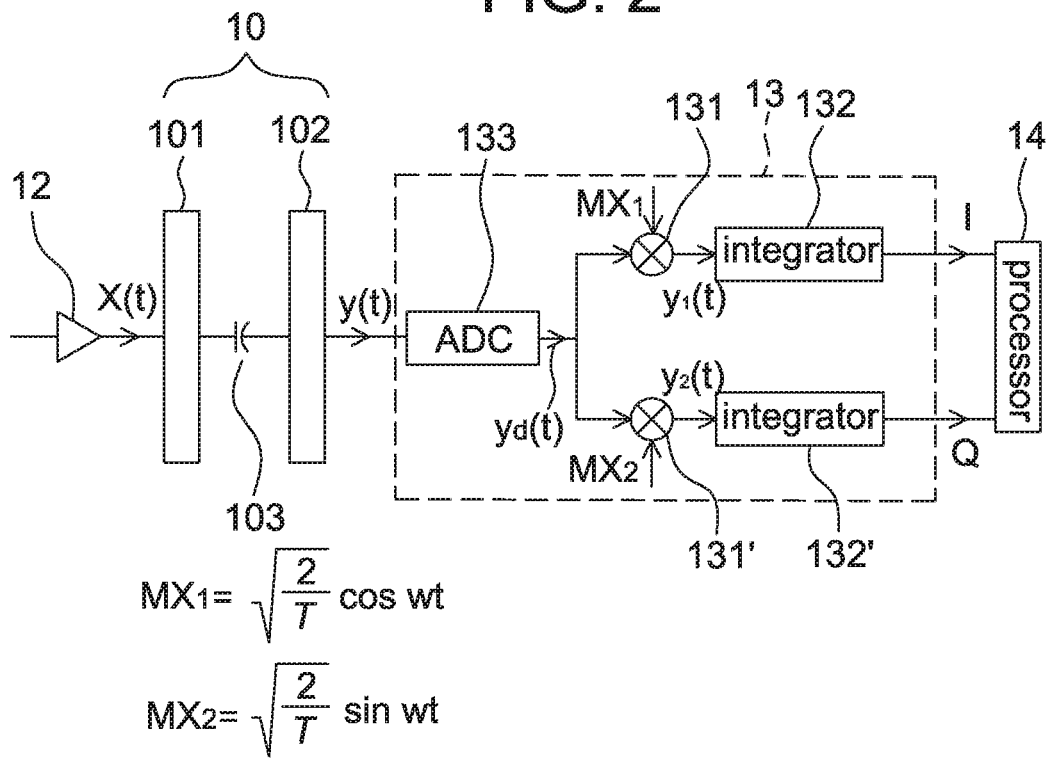
FIGS. 3A-3B are schematic block diagrams of a capacitive touch sensing device according to some embodiments of the present disclosure.
Figure 3B:
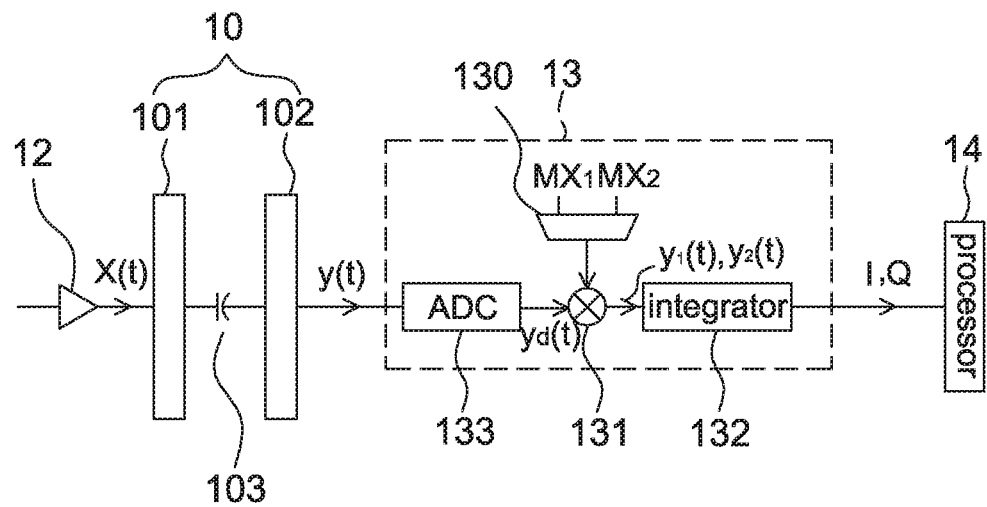

FIGS. 3A and 3B are schematic diagrams of a capacitive touch sensing device according to some embodiments of the present disclosure in which different implementations of the detection circuit 13 are shown.

In FIG. 3A, the detection circuit 13 includes an analog-to-digital converter (ADC) 133, two mixers 131 and 131', and two integrators 132 and 132', and is configured to process a detection signal y(t) to generate a two-dimensional detection vector (I,Q). The ADC 133 is configured to convert the detection signal y(t) to a digital detection signal $y_d(t)$. The two mixers 131 and 131' are configured to modulate (or mix) the digital detection signal $y_d(t)$ with two mixing signals, such as $MX_1=\sqrt{2/T}\cos(\omega t)$ and $MX_2=\sqrt{2/T}\sin(\omega t)$ herein, so as to generate a pair of modulated detection signals $y_1(t)$ and $y_2(t)$. In order to sample the pair of modulated detection signals $y_1(t)$ and $y_2(t)$, two integrators 132 and 132' are employed to respectively integrate (or accumulate) the pair of modulated detection signals $y_1(t)$ and $y_2(t)$ to generate two digital components I, Q of a two-dimensional detection vector. In this embodiment, the two integrators 132 and 132' are any proper integration circuits, such as capacitors, without particular limitations. In addition to the two continuous signals mentioned above, the two mixing signals are selected as two vectors, for example $MX_1=[1\ 0\ -1\ 0]$ and $MX_2=[0\ -1\ 0\ 1]$, so as to simplify the circuit structure. The two mixing signals may be selected from proper simplified vectors without particular limitations as long as the process of modulation is simplified.

As the two digital components I and Q are accumulated values of the pair of modulated detection signals $y_1(t)$ and $y_2(t)$, the pair of modulated detection signals $y_1(t)$ and $y_2(t)$ are sometimes directly referred to two digital components of the two-dimensional detection vector herein. As the digital detection signal $y_d(t)$ is a digitized value of the detection signal y(t), the digital detection signal $y_d(t)$ is sometimes directly referred to the detection signal y(t) herein.

In FIG. 3B, the detection circuit 13 includes an analog-to-digital converter (ADC) 133, a mixer 131 and an integrator 132, and the two mixing signals $MX_1$ and $MX_2$ are inputted to the mixer 131 via a multiplexer 130 to be modulated with the digital detection signal $y_d(t)$ so as to generate two modulated detection signals $y_1(t)$ and $y_2(t)$. In addition, functions of the ADC 133, the mixer 131 and the integrator 132 are similar to those shown in FIG. 3A and thus details thereof are not repeated herein.

A detection method of the capacitive touch sensing device of the present disclosure includes the steps of: providing a drive signal to a first electrode of a sensing element; modulating a detection signal coupled to a second electrode from the drive signal through a coupling capacitance respectively with two mixing signals so as to generate a pair of modulated detection signals; and calculating a scale of the pair of modulated detection signals to accordingly identify a touch event.

Referring to FIG. 3A or 3B for example, after the drive circuit 12 provides a drive signal X(t) to the first electrode 101 of the sensing element 10, the drive signal X(t) couples a detection signal y(t) on the second electrode 102 of the sensing element 10 through the coupling capacitance 103. Next, the detection circuit 13 respectively modulates (or mixes) the detection signal y(t) with two mixing signals $MX_1$ and $MX_2$ to generate a pair of modulated detection signals $y_1(t)$ and $y_2(t)$. The processor 14 calculates a scale of the pair of modulated detection signals $y_1(t)$ and $y_2(t)$ to accordingly identify a touch event, wherein methods of calculating a scale of the pair of modulated detection signals $y_1(t)$ and $y_2(t)$ as well as comparing the scale of the pair of modulated detection signals $y_1(t)$ and $y_2(t)$ with at least one threshold may be referred to FIG. 4 and its corresponding descriptions. In addition, before the scale of the pair of modulated detection signals $y_1(t)$ and $y_2(t)$ is calculated, the integrator 132 and/or 132' is operable to accumulate the pair of modulated detection signals $y_1(t)$ and $y_2(t)$ to output two digital components I and Q of the two-dimensional detection vector (I,Q).

Figures 5, 6:
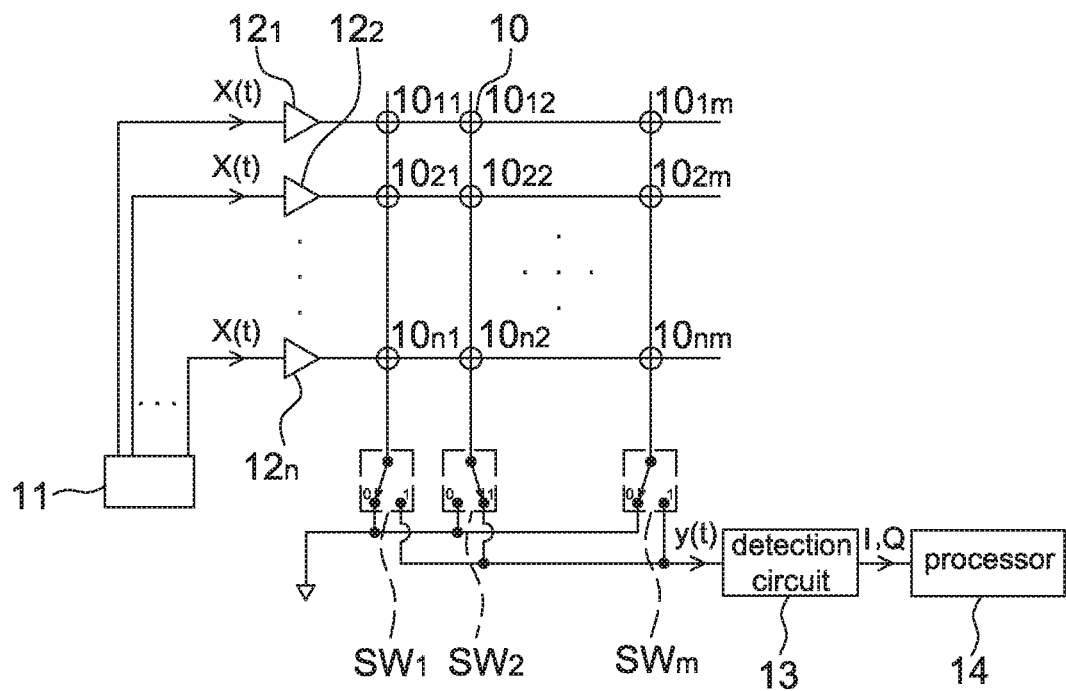
FIG. 5 is a schematic diagram of a capacitive touch system according to one embodiment of the present disclosure.
FIG. 6 is a schematic diagram of drive signals of every channel in every drive time slot of a concurrent driving capacitive touch system according to a first embodiment of the present disclosure.

Referring to FIG. 5, it is a schematic diagram of a capacitive touch system according to one embodiment of the present disclosure, i.e. a plurality of capacitive touch sensing device being able to form a capacitive touch system. A plurality of sensing elements 10 arranged in matrix forms a capacitive sensing matrix which is used as a touch panel or a touch keyboard. Each row of the sensing elements 10 is respectively driven by one of drive circuits $12_1$-$12_n$ and the detection circuit 13 detects output signals y(t) of every column of the sensing elements 10 through a plurality of switch devices $SW_1$-$SW_m$ or a multiplexer. As shown in FIG. 5, the drive circuit $12_1$ is configured to drive a first row of sensing elements $10_{11}$-$10_{1m}$; the drive circuit $12_2$ is configured to drive a second row of sensing elements $10_{21}$-$10_{2m}$; . . . ; and the drive circuit $12_n$ is configured to drive an nth row of sensing elements $10_{n1}$-$10_{nm}$; wherein, n and m are positive integers and values thereof are determined according to the size and resolution of the capacitive sensing matrix without particular limitations.

In this embodiment, each of the sensing elements 10 (shown by circles $10_{11}$ to $10_{nm}$ herein) includes a first electrode and a second electrode configured to form a coupling capacitance therebetween as shown in FIGS. 2, 3A and 3B. The drive circuits $12_1$-$12_n$ are respectively coupled to the first electrode of one row of the sensing elements 10. For example, a timing controller 11 is operable to control the drive circuits $12_1$-$12_n$ to respectively output a drive signal X(t) to the first electrode of the sensing elements 10. The drive circuits $12_1$-$12_n$ are configured to sequentially or concurrently drive the sensing elements $10_{11}$ to $10_{nm}$. It is appreciated that the drive circuits $12_1$-$12_n$ in FIG. 5 may be integrated with the timing controller 11 to form a signal drive circuit.

The detection circuit 13 is coupled to the second electrode of one column of the sensing elements 10 through a plurality of switch devices $SW_1$-$SW_m$ or a multiplexer to sequentially detect a detection signal y(t) coupled to the second electrode from the drive signal X(t) through the coupling capacitance of the sensing elements 10. The detection circuit 13 modulates the detection signal y(t) respectively with two mixing signals to generate a pair of modulated detection signals, wherein details of generating the pair of modulated detection signals have been described in FIGS. 3A to 3B and their corresponding descriptions and thus are not repeated herein.

The processor 14 identifies a touch event and a touch position according to the pair of modulated detection signals. As mentioned above, the processor 14 calculates a norm of vector of a two-dimensional detection vector formed by the pair of modulated detection signals (e.g., I and Q), and identifies the touch event by comparing the norm of vector with at least one threshold TH as FIG. 4.

In an embodiment of sequential driving, when the timing controller 11 controls the drive circuit 12$_1$ to output the drive signal X(t) to the first row of sensing elements 10$_{11}$-10$_{1m}$, the switch devices SW$_1$-SW$_m$ are sequentially conducted such that the detection circuit 13 detects the detection signal y(t) sequentially outputted by every sensing element of the first row of sensing elements 10$_{11}$-10$_{1m}$, wherein the detection corresponding to each sensing element may be referred to FIGS. 3A and 3B. Next, the timing controller 11 sequentially controls other drive circuits 12$_2$-12$_n$ to output the drive signal X(t) to every row of the sensing elements. After the detection circuit 13 detects all of the sensing elements 10$_{11}$ to 10$_{nm}$, a scan period or a frame period is accomplished. The processor 14 identifies the position(s) of the sensing elements where a touch event occurs within a scan period as a touch position. It is appreciated that said touch position may be occurred at more than one sensing elements 10, and the processor 14 takes all positions of the more than one sensing elements 10 as touch positions or takes one of the positions (e.g., a center or gravity center) of the more than one sensing elements 10 as a touch position.

In some embodiments, to save the power of the capacitive touch system in FIG. 5, the timing controller 11 controls at least a part of the drive circuits 12$_1$-12$_n$ (more than one drive circuits) to concurrently output the drive signal X(t) to corresponded rows of the sensing elements. The detection circuit 13 modulates the detection signal y(t) of different columns with different two mixing signals MX$_1$ and MX$_2$, respectively. In addition, methods of identifying a touch event and a touch position are similar to FIG. 5, and thus details thereof are not repeated herein. For example, different pairs of mixing signals MX$_1$ and MX$_2$ are previously stored in a non-volatile memory.

The detection circuit 13 may further include the filter and/or the amplifier to improve the signal quality. In addition, the processor 14 may be combined with the detection circuit 13 to form a single element, and functions thereof are implemented by software and/or hardware.

The phase shift during signal transmission caused by capacitance on signal lines may be ignored by calculating a norm of vector of a two-dimensional detection vector. In other words, if a phase shift exists between drive signals X(t) of every channel, the phase shift may also be ignored by calculating the norm of vector of the two-dimensional detection vector. Therefore, in an embodiment of concurrent driving, it is able to concurrently drive different input channels within the same drive time slot using a plurality of drive signals having a phase shift from each other, and to identify a touch event and/or a touch position by calculating a norm of vector of two-dimensional detection vectors of every output channel in the detection end. In addition, it is able to effectively use a dynamic range of ADC by phase-shifting drive signals X(t) of different input channels, wherein the phase-shifting is implemented by a random phase offset or a formulated phase offset, but not limited thereto.

Figure 7:
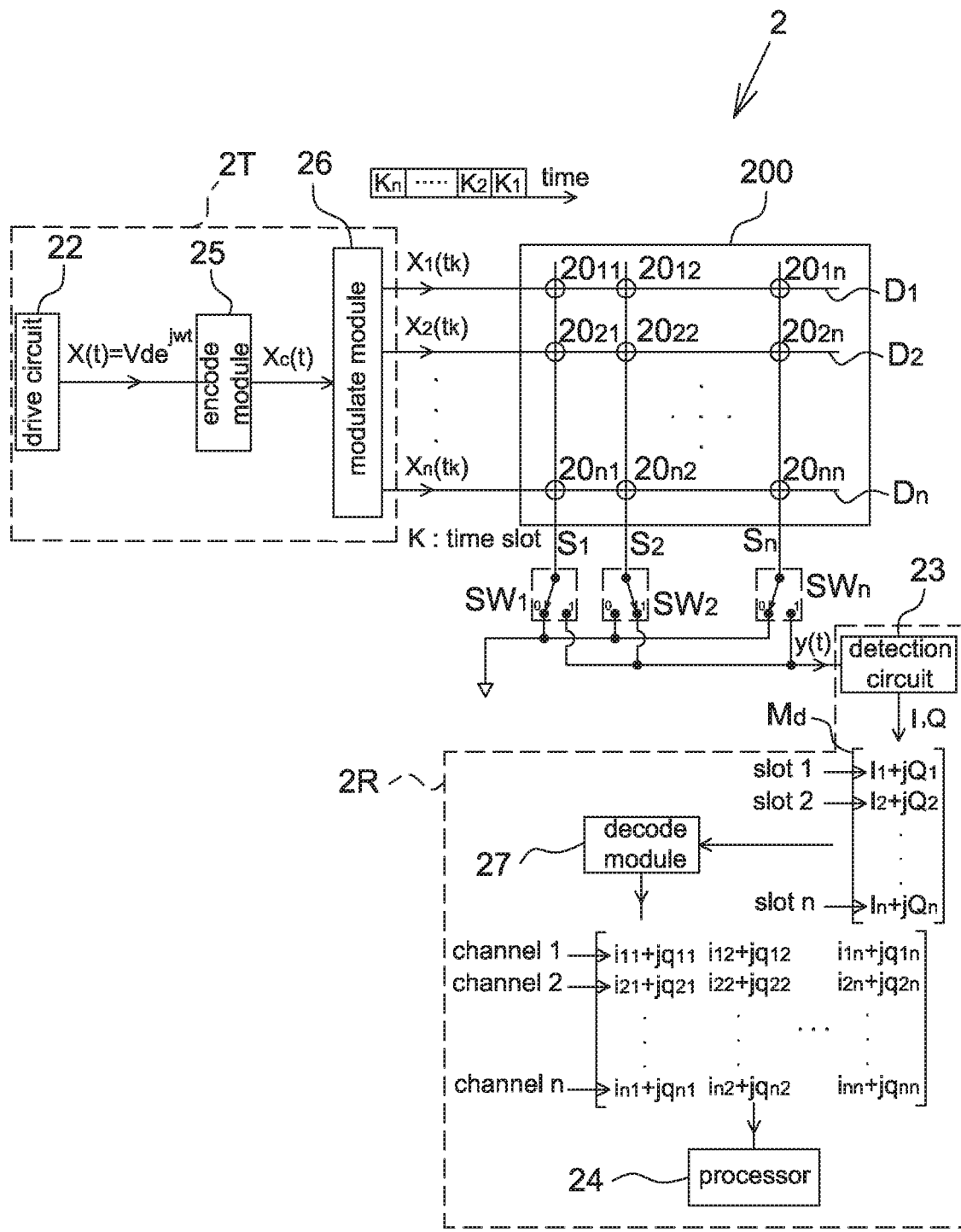
FIG. 7 is a schematic diagram of a concurrent driving capacitive touch system according to a first embodiment of the present disclosure.

Referring to FIG. 7, it is a schematic diagram of a concurrent driving capacitive touch system 2 according to a first embodiment of the present disclosure. The capacitive touch system 2 includes a drive end 2T, a capacitive sensing matrix 200 and a detection end 2R, wherein the capacitive sensing matrix 200 has a plurality of input channels and a plurality of output channels, and used as a touch panel or a touch keyboard. For example, the capacitive sensing matrix 200 includes a plurality of sensing elements (e.g., 20$_{11}$ to 20$_{nm}$) arranged in rows and columns, and said input channels herein are referred to sensing element rows (or columns) driven by the drive end 2T and said output channels herein are referred to sensing element columns (or rows) detected by the detection end 2R.

The drive end 2T is configured to concurrently input encoded and modulated drive signals to a plurality of input channels (or a plurality of drive electrodes D$_1$ to D$_n$) in each drive time slot of a plurality of drive time slots of a scan period (or a frame period) of the capacitive sensing matrix 200 in operation. The detection end 2R is sequentially coupled to a plurality of output channels (or a plurality of receiving electrodes S$_1$ to S$_n$) of the capacitive sensing matrix 200 within the frame period, and configured to decode a plurality of detection matrices Md, which are obtained by detecting the output channels, so as to generate a two-dimensional detection vector corresponding to each of the sensing elements and calculate a norm of vector of each of the two-dimensional detection vectors, wherein each matrix element of the detection matrices Md is a detection signal obtained corresponding to one receiving electrode in each of the drive time slots and the detection matrices Md are one-dimensional matrices. The method of generating matrix elements of the detection matrices Md is referred to FIGS. 3A and 3B. For example, the detection end 2R modulates a plurality of detection signals y(t) of the receiving electrodes S$_1$ to S$_n$ by two mixing signals M$_1$ and M$_2$ to respectively generate a pair of modulated detection signals y$_1$(t) and y$_2$(t), and accumulates the pair of modulated detection signals y$_1$(t) and y$_2$(t) by using the integrator to respectively generate a matrix element of the detection matrices Md corresponding to each pair of the modulated detection signals y$_1$(t) and y$_2$(t). The matrix elements associated with all drive time slots of the frame period form the detection matrices Md.

In addition, the detection end 2R further compares the norm of vectors with at least one threshold so as to identify a touch event and/or a touch position (as shown in FIG. 4). In one aspect, a number of the drive time slots is equal to a number of the input channels (or a number of the drive electrodes D$_1$ to D$_n$).

In this embodiment, the encoded and modulated drive signals are encoded by using a Hadamard matrix, i.e. the drive end 2T encoding a drive signal X(t) corresponding to each input channel by a Hadamard matrix. The detection end 2R decodes the detection matrix Md using an inverse Hadamard matrix of the Hadamard matrix. The encoded and modulated drive signals may only be phase modulated or may be phase and amplitude modulated, e.g., using quadrature amplitude modulation (QAM).

In one embodiment, the capacitive touch system 2 includes a drive circuit 22, an encoding module 25, a modulation module 26, the capacitive sensing matrix 200, a detection circuit 23, a decoding module 27 and a processor 24. In one embodiment, the drive circuit 22, the encoding module 25 and the modulation module 26 are combined to form the drive end 2T; and the detection circuit 23, the decoding module 27 and the processor 24 are combined to form the detection end 2R, wherein the detection end 2R further includes an analog front end. It is appreciated that the drive end 2T and the detection end 2R may operate synchronously. In the present disclosure, every module is implemented by a hardware circuit and/or firmware.

In another embodiment, the encoding module 25 and the modulation module 26 may be combined to form a single encoding and modulation module; and the decoding module 27 may be integrated with the processor 24 or the detection circuit 23.

The drive circuit 22 outputs a drive signal X(t) to the encoding module 25, e.g., X(t)=Vd×exp(jwt), wherein Vd indicates a drive voltage value, w indicates a driving frequency and t indicates time. As described above, the drive signal X(t) is not limited to a continuous signal.

The encoding module 25 is configured to encode the drive signal X(t) corresponding to each row of the sensing elements (or each drive electrode $D_1$ to $D_n$) so as to output a plurality of encoded drive signals Xc(t). As mentioned above, the encoding module 25 encodes the drive signal X(t) using an encoding matrix, e.g., a Hadamard matrix. It is appreciated that as long as signals of every input channel are distinguishable by encoding, other encoding matrices may be used. In addition, a size of the encoding matrix is determined by a number of input channels.

The modulation module 26 is configured to perform the phase modulation on the encoded drive signals Xc(t) corresponding to each row of the sensing elements (or each drive electrode $D_1$ to $D_n$) so as to concurrently output encoded and modulated drive signals to each row of the sensing elements, and said phase modulation is to cause the encoded and modulated drive signals inputted into different rows of the sensing elements (or different drive electrodes $D_1$ to $D_n$) to have a phase shift from each other. Accordingly, it is able to decrease an input voltage of the analog-to-digital (ADC) converter in the detection end 2R (as FIGS. 3A and 3B) so as not to exceed a dynamic range of the ADC converter. In other embodiments, the encoded drive signals Xc(t) may also be amplitude and phase modulated, e.g., using quadrature amplitude modulation. For example in FIG. 7, the modulation module 26 outputs an encoded and modulated drive signal $X_1(t_k)$ to a first input channel, an encoded and modulated drive signal $X_2(t_k)$ to a second input channel . . . and an encoded and modulated drive signal $X_n(t_k)$ to an nth input channel, wherein k is referred to each drive time slot in a scan period herein, and $X_1(t_k)$ to $X_n(t_k)$ may be referred to FIG. 6.

For example, an encoding matrix may use equation (1) as an example and each matrix element thereof is indicated by $a_{rs}$, wherein the subscript "r" of each matrix element $a_{rs}$ is associated with each drive time slot (e.g. $K_1$ to $K_n$) and the subscript "s" of each matrix element $a_{rs}$ is associated with each input channel.

$$\begin{bmatrix} a_{11} & a_{12} & \cdots & a_{1n} \\ a_{21} & a_{22} & \cdots & a_{2n} \\ & & \ddots & \\ a_{n1} & a_{n2} & \cdots & a_{nn} \end{bmatrix} \quad (1)$$

The operation of the modulation module 26 may be represented mathematically by a diagonal matrix shown in equation (2), wherein $x_1$ to $x_n$ are complex numbers and preferably have a phase shift from each other. $x_1$ to $x_n$ are configured to perform the phase modulation on different input channels, respectively. When the quadrature amplitude modulation (QAM) is used as a modulation mechanism, $x_1$ to $x_n$ have an amplitude shift and a phase shift from each other, wherein the subscript of $x_1$ to $x_n$ is associated with each input channel.

$$\begin{bmatrix} x_1 & 0 & \cdots & 0 \\ 0 & x_2 & \cdots & 0 \\ & & \ddots & \\ 0 & 0 & \cdots & x_n \end{bmatrix} \quad (2)$$

Referring to FIGS. 6 and 7, based on equations (1) and (2), the modulation module 26 concurrently outputs a drive signal $X(t)a_{11}x_1$ to the first input channel (or the drive electrode $D_1$), a drive signal $X(t)a_{12}x_2$ to the second input channel (or the drive electrode $D_2$) . . . and a drive signal $X(t)a_{1n}x_n$ to the nth input channel (or the drive electrode $D_n$) in a first drive time slot k=1; the modulation module 26 concurrently outputs a drive signal $X(t)a_{21}x_1$ to the first input channel, a drive signal $X(t)a_{22}x_2$ to the second input channel . . . and a drive signal $X(t)a_{2n}x_n$ to the nth input channel in a second drive time slot k=2; . . . and the modulation module 26 concurrently outputs a drive signal $X(t)a_{n1}x_1$ to the first input channel, a drive signal $X(t)a_{n2}x_2$ to the second input channel . . . and a drive signal $X(t)a_{nn}x_n$ to the nth input channel in an nth drive time slot k=n. After the encoded and modulated drive signals $X_1(t_k)$ to $X_n(t_k)$ of all time slots k=1 to k=n are inputted into the capacitive sensing matrix 200, the operation of one drive frame (or frame period) is accomplished. In this embodiment, the drive time slots $K_1$ to $K_n$ are continuous in time or separated by a predetermined time interval from one another.

As mentioned above, the capacitive sensing matrix 200 includes a first row of sensing elements $20_{11}$ to $20_{1n}$, a second row of sensing elements $20_{21}$ to $20_{2n}$, . . . and an nth row of sensing elements $20_{n1}$ to $20_{nn}$ (i.e. input channels 1 to n). The encoded and modulated drive signals $X(t)a_{11}x_1$, $X(t)a_{12}x_2$, . . . $X(t)a_{1n}x_n$ are respectively inputted into the first row of sensing elements $20_{11}$ to $20_{1n}$, the second row of sensing elements $20_{21}$ to $20_{2n}$, . . . and the nth row of sensing elements $20_{n1}$ to $20_{nn}$ in the first drive time slot k=1. The encoded and modulated drive signals inputted into each row of the sensing elements in other drive time slots k=2 to k=n are also shown in FIG. 6. In addition, signal lines of the capacitive sensing matrix 200 have different reactance with respect to drive signals of different channels, and an one-dimensional matrix $[y_1 \, y_2 \, \ldots \, y_n]^T$ may be used to represent a reactance matrix of the capacitive sensing matrix 200 mathematically. In one scan period, when the capacitive sensing matrix 200 is not touched, the reactance matrix is substantially unchanged; whereas when a touch occurs, at least one matrix element of the reactance matrix is changed such that the detection signal y(t) is changed accordingly.

As shown in FIG. 7, each column of the sensing elements of the capacitive sensing matrix 200 is coupled to the detection circuit 23 via a respective switch device $SW_1$ to $SW_n$ or a multiplexer. Within each drive time slot $K_1$ to $K_n$ of one scan period, the switch devices $SW_1$ to $SW_n$ sequentially couple a corresponded column of the sensing elements to the detection circuit 23 to cause the detection circuit 23 to couple to the capacitive sensing matrix 200 and generate a detection matrix Md corresponding to each column of the sensing elements according to a detection signal y(t) of each column of the sensing elements. For example FIG. 7 shows that the switch device $SW_2$ couples the second column of the sensing elements of the capacitive sensing matrix 200 to the detection circuit 23 to generate a detection matrix Md corresponding to the second receiving electrode $S_2$.

The method of generating each matrix element $(I_1+jQ_1)$ to $(I_n+jQ_n)$ of the detection matrix Md is, for example, referred to FIGS. 3A and 3B. For example, the detection circuit 23 modulates the detection signal y(t) of each drive time slot $K_1$ to $K_n$ respectively with two mixing signals $MX_1$ and $MX_2$ to generate a pair of modulated detection signals $y_1(t)$ and $y_2(t)$, and accumulate the pair of modulated detection signals $y_1(t)$ and $y_2(t)$ corresponding to each drive time slot $K_1$ to $K_n$ by the integrator (e.g., 132, 132') to generate matrix elements of the detection matrix Md. More specifically, the detection circuit 23 respectively generates, within each drive time slot $K_1$ to $K_n$, a detection signal, a pair of modulated detection signals and a matrix element corresponding to one output channel, and the matrix elements of all drive time slots $K_1$ to $K_n$ form the detection matrix Md.

Therefore, after one scan period (i.e. one frame), the detection signal y(t) from every column of the sensing elements of the capacitive sensing matrix 200 may be represented by X(t)×[encoding matrix]×[modulation matrix]×[reactance matrix] as shown in equation (3) mathematically, wherein matrix elements of the encoding matrix are determined according to the encoding method being used; matrix elements of the modulation matrix are determined according to the modulation mechanism being used; and matrix elements of the reactance matrix are determined according to the capacitive sensing matrix 200. As mentioned above, the detection circuit 23 includes at least one integrator (as shown in FIGS. 3A and 3B) configured to obtain two digital components, e.g., $(I_1,Q_1)$ to $(I_n,Q_n)$ of the two-dimensional detection vector (I+j Q) according to the detection signal y(t).

$$y(t) = x(t) \times \begin{bmatrix} a_{11} & a_{12} & \dots & a_{1n} \\ a_{21} & a_{22} & \dots & a_{2n} \\ & & \ddots & \\ a_{n1} & a_{n2} & \dots & a_{nn} \end{bmatrix} \times \begin{bmatrix} x_1 & 0 & \dots & 0 \\ 0 & x_2 & \dots & 0 \\ & & \ddots & \\ 0 & 0 & \dots & x_n \end{bmatrix} \times \begin{bmatrix} y_1 \\ y_2 \\ \vdots \\ y_n \end{bmatrix} \quad (3)$$

Therefore, detection vectors corresponding to each column of the sensing elements outputted by the detection circuit 23 after one scan period may be represented by a detection matrix Md=$[(I_1+jQ_1) (I_2+jQ_2) \dots (I_n+jQ_n)]^T$, wherein $(I_1+jQ_1)$ is the detection vector obtained according to a detection signal y(t) of one column (e.g. the second column) of the sensing elements in the first drive time slot k=1. As the encoded and modulated drive signals $X_1(t_k)$ to $X_n(t_k)$ are respectively inputted into every input channel in the first drive time slot k=1, the detection vector $(I_1+jQ_1)$ contains the superposition of detection signals associated with all input channels in the first drive time slot k=1 and is a superposed detection vector. Similarly, $(I_2+jQ_2)$ is the detection vector obtained according to the detection signal y(t) of one column of the sensing elements in the second drive time slot k=2 and is a superposed detection vector of detection signals associated with all input channels in the second drive time slot k=2; . . . ; $(I_n+jQ_n)$ is the detection vector obtained according to the detection signal y(t) of one column of the sensing elements in the nth drive time slot k=n and is a superposed detection vector of detection signals associated with all input channels in the nth drive time slot k=n. More specifically, each of the matrix elements $(I_1+jQ_1)$ to $(I_n+jQ_n)$ of the detection matrix Md is a superposed detection vector.

For decoupling the superposed detection vectors associated with every input channel, the detection circuit 23 sends the detection matrix Md to the decoding module 27 for decoding thereby respectively generate a two-dimensional detection vector corresponding to every sensing element (e.g. $20_{11}$ to $20_{nn}$). For example, the decoding module 27 outputs two-dimensional detection vectors of every input channel (i.e. the sensing element) in one column (e.g., the second column) of the sensing elements as shown by equation (4), wherein the two-dimensional detection vector corresponding to input channel 1 of the second column of the sensing elements is represented by $(i_{12}+jq_{12})$, the two-dimensional detection vector corresponding to input channel 2 of the second column of the sensing elements is represented by $(i_{22}+jq_{22})$, . . . and the two-dimensional detection vector corresponding to input channel n of the second column of the sensing elements is represented by $(i_{n2}+jq_{n2}$, wherein i and q are two digital components of the two-dimensional detection vectors, and $(i_{12}+jq_{12})$ to $(i_{n2}+jq_{n2})$ are decoupled two-dimensional detection vectors. In FIG. 7, after one scan period, the decoding module 27 may output a set of two-dimensional detection vectors (i+jq) corresponding to every column of the sensing elements (or every receiving electrode); i.e. n sets of decoupled two-dimensional detection vectors $[(i_1+jq_1) (i_2+jq_2) \dots (i_n+jq_n)]^T$ and each two-dimensional detection vector corresponds to one sensing element. The decoding module 27 may use an inverse matrix of the encoding matrix, e.g., using an inverse matrix of the Hadamard matrix, to decode the superposed detection vectors (i.e. the detection matrices) to decouple the superposed detection vectors.

$$\begin{bmatrix} i_1 + jq_1 \\ i_2 + jq_2 \\ \vdots \\ i_n + jq_n \end{bmatrix} = \begin{bmatrix} I_1 + jQ_1 \\ I_2 + jQ_2 \\ \vdots \\ I_n + jQ_n \end{bmatrix} \begin{bmatrix} a_{11} & a_{12} & \dots & a_{1n} \\ a_{21} & a_{22} & \dots & a_{2n} \\ & & \ddots & \\ a_{n1} & a_{n2} & \dots & a_{nn} \end{bmatrix}^T \quad (4)$$

Finally, the processor 24 calculates a norm of vector of each of the two-dimensional detection vectors, e.g., $(i_{11}+jq_{11})$ to $(i_{nn}+jq_{nn})$, and compares the obtained norm of vectors with at least one threshold TH to confirm a touch as shown in FIG. 4.

Accordingly, after one scan period, the processor 24 identifies a touch event and/or a touch position on the capacitive sensing matrix 200 according to comparison results of comparing n×n norm of vectors with the threshold TH, wherein n is a size of the capacitive sensing matrix.

In addition, when the drive signal X(t) is also amplitude modulated in this embodiment, the processor 24 may further include an automatic level control (ALC) to eliminate the amplitude shift. For example, the control parameter of the ALC when the capacitive sensing matrix 200 is not touched is previously stored in the processor 24 (or an additional memory) to allow detection results of every sensing element to be substantially identical. Accordingly, when a touch occurs, it is able to identify the touch event more accurately.

In addition, as mentioned above, each of the sensing elements ($20_{11}$ to $20_{nn}$) includes a first electrode 101 and a second electrode 102 configured to form a coupling capacitance 103 (as shown in FIGS. 2, 3A and 3B). The encoded and modulated drive signals $X_1(t_k)$ to $X_n(t_k)$ are coupled to the first electrode 101. The detection circuit 23 is coupled to the second electrode 102 and configured to detect a detection signal y(t) coupled to the second electrode 102 from the encoded and modulated drive signals $X_1(t_k)$ to $X_n(t_k)$ through the coupling capacitance 103.

Figure 8:
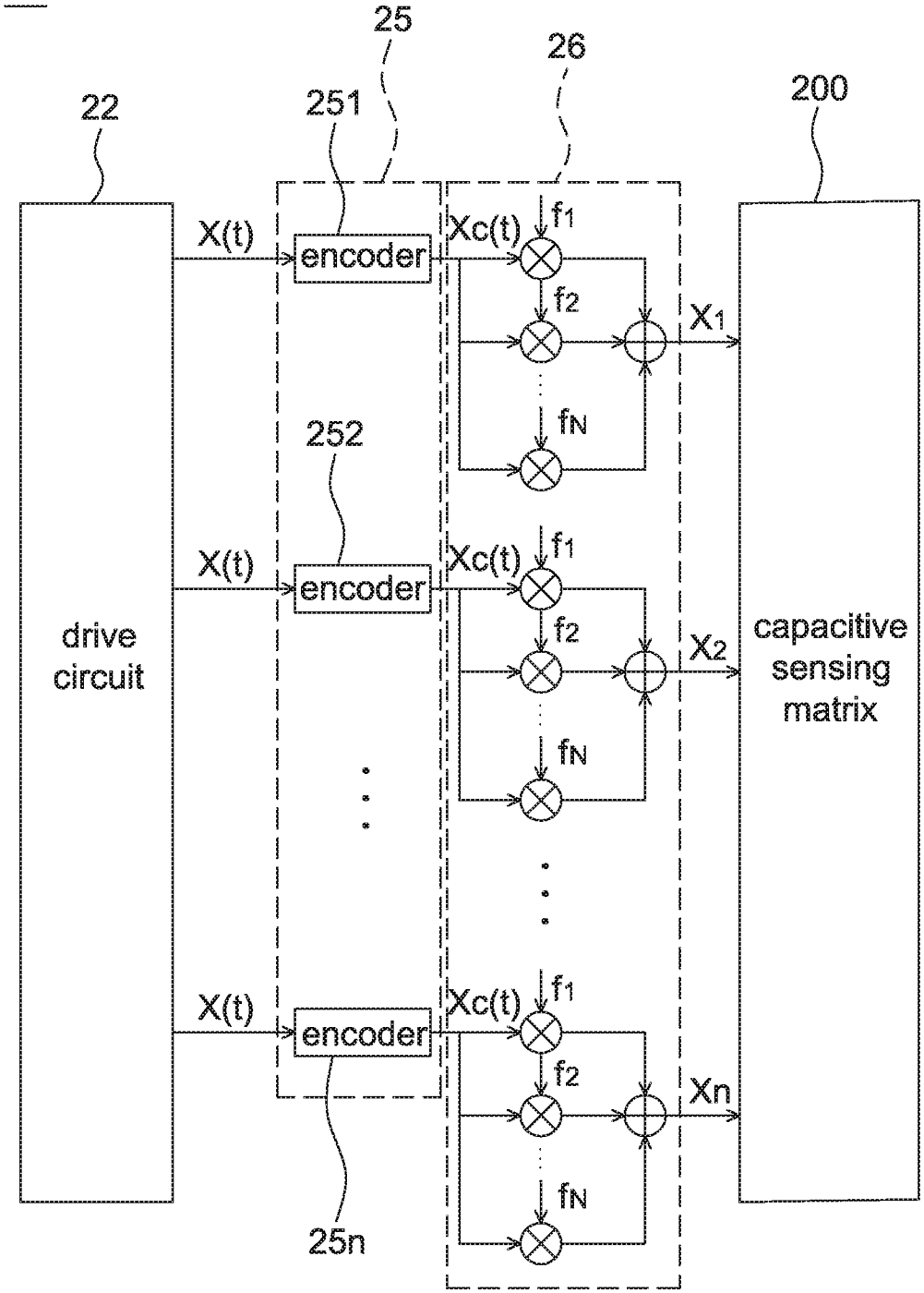
FIG. 8 is a schematic block diagram of a drive end of a capacitive touch system according to a second embodiment of the present disclosure.
Figure 9:
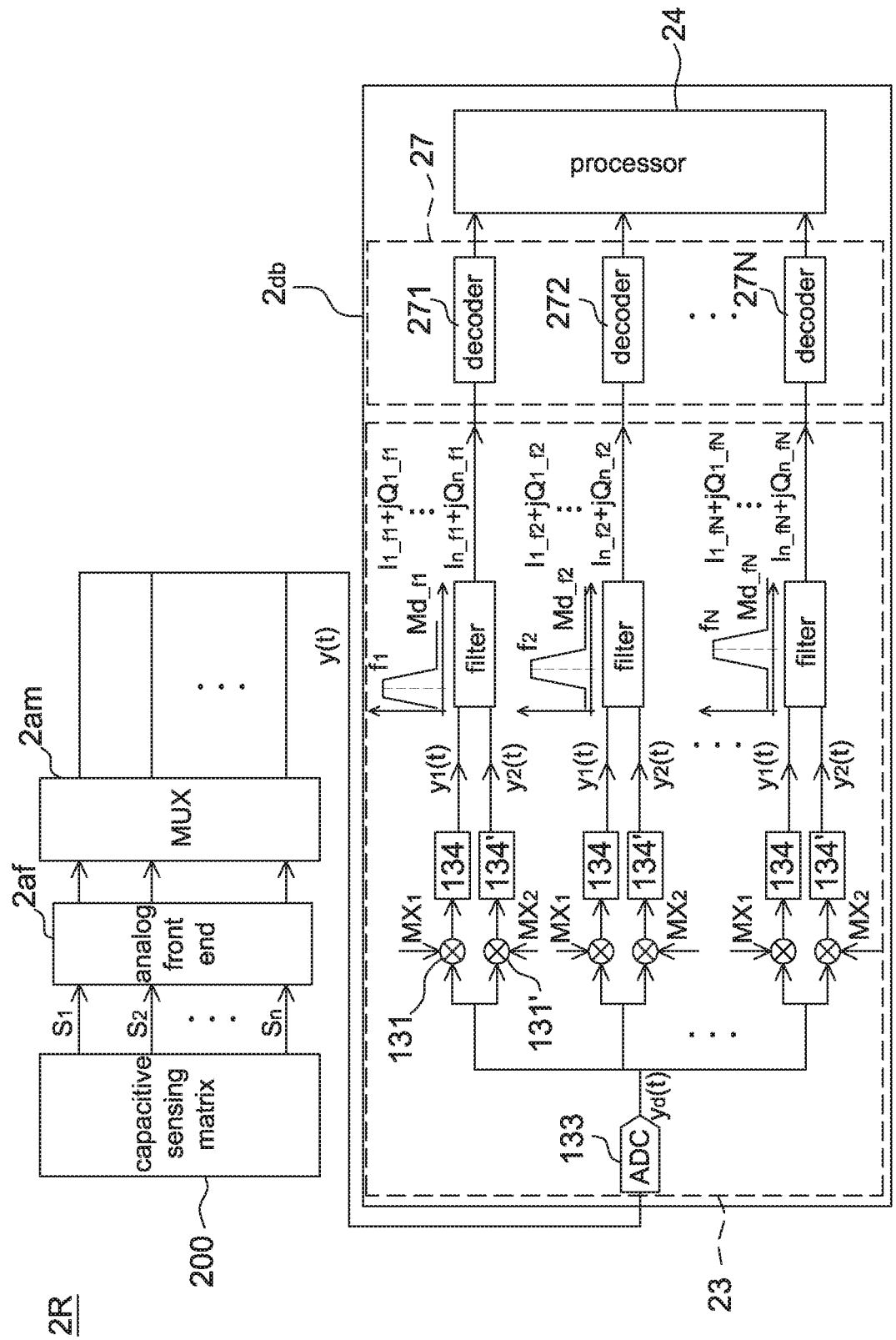
FIG. 9 is a schematic block diagram of a detection end of a capacitive touch system according to a second embodiment of the present disclosure.

Referring to FIGS. 8 and 9, FIG. 8 is a schematic block diagram of a drive end 2T of a capacitive touch system according to a second embodiment of the present disclosure; and FIG. 9 is a schematic block diagram of a detection end 2R of a capacitive touch system according to a second embodiment of the present disclosure. The capacitive touch system of this embodiment also includes a capacitive sensing matrix 200, a drive end 2T and a detection end 2R, and is different from FIG. 7 in that the modulation module 26 further generates a drive signal containing a plurality of driving frequencies to drive the capacitive sensing matrix 200, which is functioned as a touch panel or a touch keyboard. In addition, the modulation module 26 is still able to perform the phase modulation on the encoded drive signals Xc(t) corresponding to each row of the sensing elements as the above first embodiment such that the encoded and modulated drive signals corresponding to different rows of the sensing elements have a phase difference from each other to improve the dynamic detection range.

The capacitive sensing matrix 200 also includes a plurality of drive electrodes $D_1$-$D_n$ and a plurality of receiving electrodes $S_1$-$S_n$ to form a plurality of sensing elements $20_{11}$-$20_{mn}$ arranged in rows and columns as shown in FIG. 7. In FIG. 8, the encoding module 25 is shown to include encoders 251-25n configured to respectively encode a drive signal X(t) outputted by the drive circuit 22, and it is only intended to illustrate but not to limit the present disclosure. The encoding module 25 is configured to encode the drive signal X(t) corresponding to each row of the sensing elements to output a plurality of encoded drive signals Xc(t), and the encoding method has been illustrated above and thus details thereof are not repeated herein.

Figure 10:
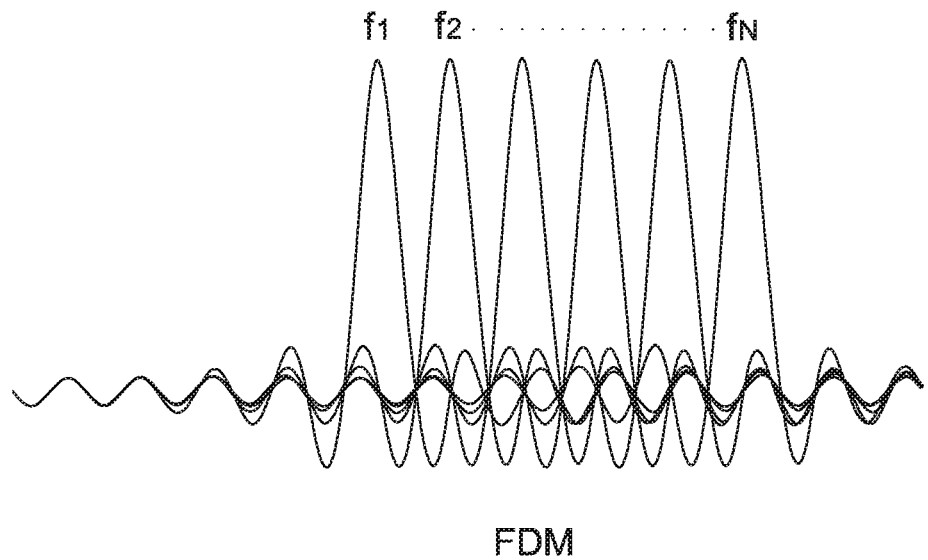
FIG. 10 is a schematic diagram of modulated drive signals according to some embodiments of the present disclosure.
Figure 10:
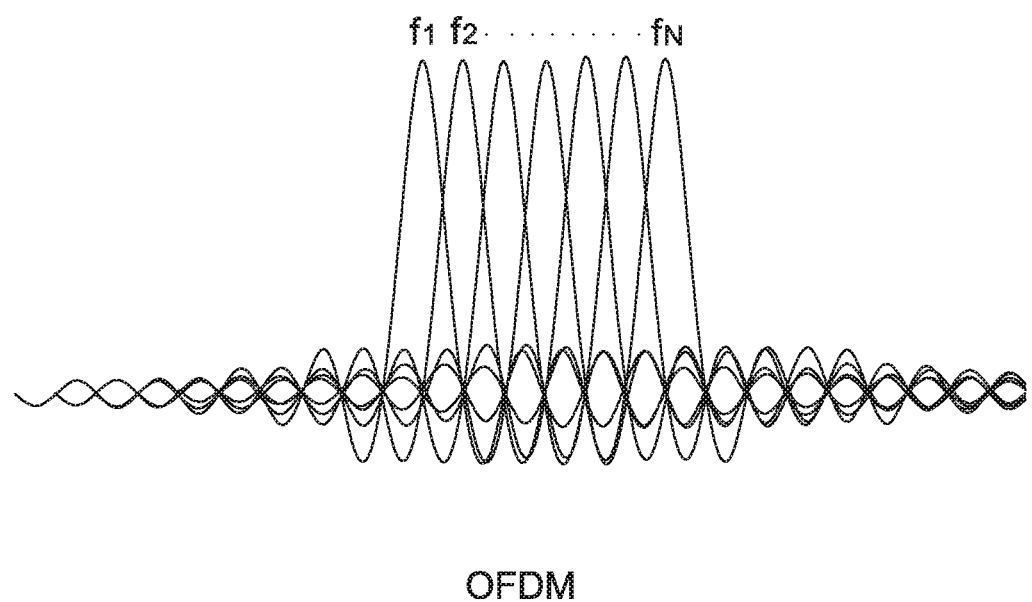

In this embodiment, the modulation module 26 modulates the encoded drive signals Xc(t) using frequency division multiplexing (FDM) to concurrently output a plurality of encoded and modulated drive signals $X_1$-$X_n$ to each row of the sensing elements (or drive electrodes $D_1$-$D_n$), wherein each of the encoded and modulated drive signals $X_1$-$X_n$ contains a plurality of driving frequencies $f_2$-$f_N$. The modulation module 26 modulates the encoded drive signals Xc(t) using conventional frequency division multiplexing or orthogonal frequency division multiplexing (OFDM) as shown in FIG. 10. For example, FIG. 8 shows that a plurality of driving frequencies $f_1$-$f_N$ are used to modulate the drive signal Xc(t) and the signal mixing is performed to generate the encoded and modulated drive signals $X_1$-$X_n$. In some embodiments, a frequency difference between the driving frequencies $f_1$-$f_N$ is selected between 50 KHZ to 150 KHZ, but not limited thereto. A number of the driving frequencies $f_1$-$f_N$ is not particularly limited and is determined according to the frequency difference and an operable frequency range.

In FIG. 9, the detection end 2R is shown to include an analog front end 2af, a multiplexer 2am and a digital back end 2db. The analog front end 2af is used to, for example, convert current signals to voltage signals and to filter the voltage signals using an analog filter to increase the signal to noise ratio and output a detection signal y(t). In other words, in this embodiment the detection signal y(t) is a voltage signal. The multiplexer 2am is used to, for example, couple the detection signals y(t) of different receiving electrodes $S_1$-$S_n$ to an analog to digital converter 133 for digitization, wherein the function of the multiplexer 2am is similar to the switch devices $SW_1$ to $SW_n$ of FIG. 7. In some embodiments, the analog to digital converter 133 digitizes the detection signal y(t) using an oversampling to generate a digital detection signal $y_d$(t). In FIG. 9, although the analog to digital converter 133 is shown to be included in the detection circuit 23, it is only intended to illustrate but not to limit the present disclosure as long as the analog to digital converter 133 is coupled between the capacitive sensing matrix 200 and the detection circuit 23.

The detection circuit 23 is electrically coupled to the capacitive sensing matrix 200 and configured to respectively generate a detection matrix Md corresponding to each of the driving frequencies $f_1$-$f_N$ according to a detection signal y(t) of each column of the sensing elements. For example, corresponding to each receiving electrode $S_1$-$S_n$, the detection circuit 23 generates a detection matrix $Md\_f_1 = [I_{1\_f1} + jQ_{1\_f1} \ldots I_{n\_f1} + jQ_{n\_f1}]^T$ corresponding to the driving frequency $f_1$; generates a detection matrix $Md\_f_2 = [I_{1\_f2} + jQ_{1\_f2} \ldots I_{n\_f2} + jQ_{n\_f2}]^T$ corresponding to the driving frequency $f_2$; . . . and generates a detection matrix $Md\_f_N = [I_{1\_fN} + jQ_{1\_fN} \ldots I_{n\_fN} + jQ_{n\_fN}]^T$ corresponding to the driving frequency $f_N$. In some embodiments, the detection circuit 23 includes at most 2N mixers 131, 131' and N bandpass filters, wherein N is a number of the driving frequencies $f_1$-$f_N$. It is appreciated that if all driving frequencies $f_1$-$f_N$ are not used together, an effective number of N is not fixed.

As mentioned above, a pair of mixers 131, 131' are used to modulate the detection signal, e.g., the digital detection signal $y_d$(t), using two mixing signals $MX_1$ and $MX_2$ to generate a pair of modulated detection signals $y_1$(t) and $y_2$(t). The bandpass filters are used to filter the pair of modulated detection signals $y_1$(t) and $y_2$(t) to respectively generate every matrix element of a detection matrix Md corresponding to each of the driving frequencies $f_1$-$f_N$.

As mentioned above, if a concurrent driving mode is adopted, every matrix element of the detection matrix Md is a superposed detection vector which needs to be decoupled by the decoding module 27. If the concurrent driving mode is not adopted, each matrix element of the detection matrix Md is a two-dimensional detection vector corresponding to one sensing element.

More specifically, as the drive signals $X_1$(tk)-$X_n$(tk) provided to each row of the sensing elements in FIG. 7 contain a single frequency, a single detection matrix Md is generated corresponding to each column of the sensing elements (or receiving electrodes $S_1$-$S_n$). In FIG. 9, as the drive signals $X_1$-$X_n$ provided to each row of the sensing elements is a mixed signal containing a plurality of driving frequencies $f_1$-$f_N$, the detection circuit 23 respectively generate one detection matrix Md corresponding to each of the driving frequencies $f_1$-$f_N$ corresponding to each column of the sensing elements (or receiving electrodes $S_1$-$S_n$). Accordingly, when some frequencies are interfered by noises, those driving frequencies among the driving frequencies $f_1$-$f_N$ having better signal quality are directly selected in the following touch identification without using so-called frequency hopping which sequentially drives the capacitive sensing matrix 200 in order to select a proper driving frequency. In some embodiments, when the analog to digital converter 133 samples the detection signal y(t) using an oversampling, the detection circuit 23 further includes downconversion units 134 and 134' to perform a downconversion on the pair of modulated detection signals $y_1$(t) and $y_2$(t), and a ratio of the downconversion is determined according to a multiple of the oversampling.

The decoding module 27 decodes the detection matrices $Md\_f_1$ to $Md\_f_N$ to output a plurality of two-dimensional detection vectors corresponding to each of the sensing units (e.g., $20_{11}$-$20_{nn}$ shown in FIG. 7), wherein the plurality of two-dimensional detection vectors associated with each of the sensing elements respectively correspond to the driving frequencies $f_1$-$f_N$. More specifically, the decoding module 27 obtains a plurality of two-dimensional detection vectors $i_{11}+iq_{11}$ corresponding to the sensing elements $20_{11}$, and each two-dimensional detection vector $i_{11}+iq_{11}$ corresponds to one of the driving frequencies $f_1$-$f_N$. Similarly, the decoding module 27 respectively obtains a plurality of two-dimensional detection vectors $i_{12}+iq_{12}$ to $i_{nn}+iq_{nn}$ corresponding to the sensing elements $20_{12}$-$20_{nn}$. Accordingly, the processor 24 respectively calculates norm of vectors of n×n two-dimensionl detection vectors corresponding to each of the driving frequencies $f_1$-$f_N$, i.e. N×n×n norm of vectors.

More specifically, in the above first embodiment, the drive signal of the drive end 2T for driving each of the input channels substantially contains a single driving frequency, and thus the detection end 2R generates one two-dimensional detection vector and a norm of vector thereof corresponding to each sensing element within every frame period. In the second embodiment, the drive signal of the drive end 2T for driving each of the input channels contains a plurality of driving frequencies, and thus the detection end 2R generates a plurality of two-dimensional detection vectors and norm of vectors thereof corresponding to each sensing element within every frame period, wherein the two-dimensional detection vectors and norm of vectors respectively correspond to the driving frequencies $f_1$-$f_N$. The method of generating each two-dimensional vector and norm of vector in the second embodiment is similar to that of the first embodiment, only the second embodiment further including the steps of mixing and extracting signals of different driving frequencies.

It should be mentioned that the single driving frequency mentioned in this embodiment is referred to a predetermined operating frequency between the drive end 2T and the detection end 2R. In some conditions, the drive signal may be interfered by noises to contain other frequency signals. In the present disclosure, said driving frequency does not include the noise frequency.

Figure 11:
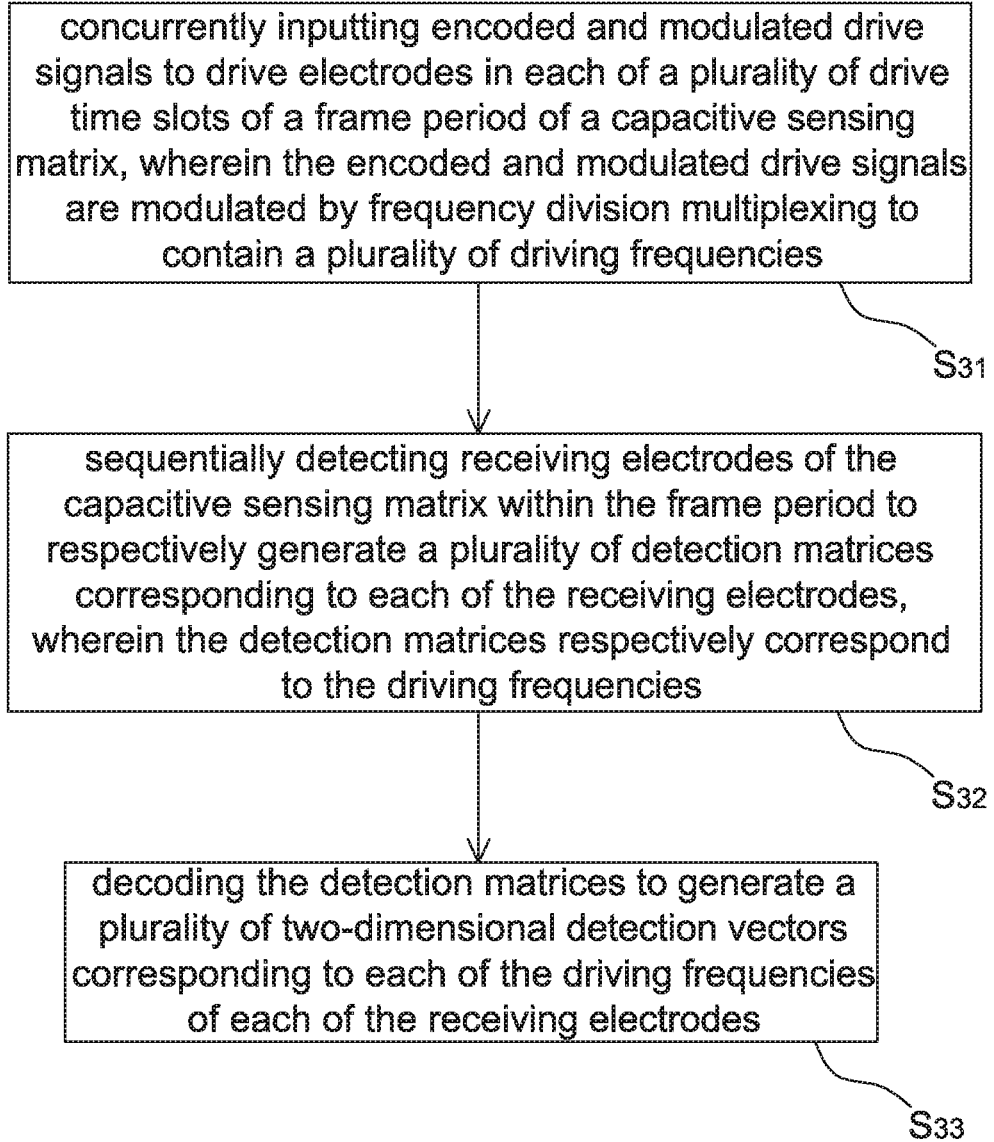
FIG. 11 is a flow chart of an operating method of a capacitive touch system according to a second embodiment of the present disclosure.

Referring to FIG. 11, it is a flow chart of an operating method of a capacitive touch system according to a second embodiment of the present disclosure which includes the steps of: concurrently inputting encoded and modulated drive signals $X_1$-$X_n$ to the drive electrodes $D_1$-$D_n$ in each drive time slot of a plurality of drive time slots of a frame period of the capacitive sensing matrix 200, wherein the encoded and modulated drive signals $X_1$-$X_n$ are modulated by frequency division multiplexing (FDM) to contain a plurality of driving frequencies $f_1$-$f_N$ (Step S31); sequentially detecting the receiving electrodes $S_1$-$S_n$ of the capacitive sensing matrix 200 within the frame period to respectively generate a plurality of detection matrices Md corresponding to each of the receiving electrodes $S_1$-$S_n$, wherein the detection matrices Md associated with each of the receiving electrodes $S_1$-$S_n$ respectively correspond to the driving frequencies $f_1$-$f_N$ (Step S32); and decoding the detection matrices Md to generate a plurality of two-dimensional detection vectors corresponding to each of the driving frequencies $f_1$-$f_N$ of each of the receiving electrodes $S_1$-$S_n$ (Step S33). Details of this operating method has been illustrated above, e.g., the Step S31 being performed by the drive end 2T, and the Steps S32-S33 being performed by the detection end 2R, and thus details thereof are not repeated herein.

As mentioned above, the detection end 2R modulates a plurality of detection signals y(t) obtained by detecting the receiving electrodes $S_1$-$S_n$ using two mixing signals $MX_1$ and $MX_2$ to respectively generate a pair of modulated detection signals $y_1(t)$ and $y_2(t)$. The detection end 2R further filters the pair of modulated detection signals $y_1(t)$ and $y_2(t)$ using a digital filter (e.g., a bandpass filter) to respectively generate the detection matrices $Md\_f_1$ to $Md\_f_N$ corresponding to the driving frequencies $f_1$-$f_N$ as shown in FIG. 9. As mentioned above, before decoding, the matrix elements of the detection matrices may be integrated or accumulated at first.

In some embodiments, the detection end 2R further uses downconversion units 134, 134' to perform a downconversion on the pair of modulated detection signals $y_1(t)$ and $y_2(t)$, and a ratio of the downconversion is determined according to a multiple of the oversampling performed by the analog to digital converter 133.

Finally, the detection end 2R calculates norm of vectors of a plurality of two-dimensional detection vectors corresponding to each of the sensing elements (e.g., $20_{11}$-$20_{nn}$ shown in FIG. 7), wherein each of the plurality of two-dimensional detection vectors corresponding to each of the sensing elements $20_{11}$-$20_{nn}$ corresponds to one of the driving frequencies $f_1$-$f_N$. The detection end 2R compares the norm of vectors with at least one threshold to identify a touch as shown in FIG. 4.

Accordingly, the capacitive touch system of the second embodiment of the present disclosure is able to detect detection results of a plurality of driving frequencies $f_1$-$f_N$ within one frame period to directly select the detection result of those driving frequencies having better signal quality to be outputted or to compare the detection results of every driving frequencies to confirm the touch state thereby improving the identification accuracy and reducing the power consumption and detection time interval.

It should be mentioned that although the above embodiments take the mutual capacitive touch system as an example for illustration, the present disclosure is not limited thereto. More specifically, the capacitive touch system of the present disclosure is applicable to both the self and mutual capacitive touch systems as long as mixed signals inputted into each input channel contain a plurality of driving frequencies $f_1$-$f_N$. The detection circuit respectively generates a two-dimensional detection vector corresponding to each of the driving frequencies $f_1$-$f_N$ and corresponding to each sensing element. The processor 24 selects the driving frequency having an optimum signal to noise ratio among the two-dimensional detection vectors corresponding to each sensing element to achieve the object of eliminating the noise interference. The processor 24 may further calculate an average, a summation or a weighted summation of the plurality of two-dimensional detection vectors corresponding to different driving frequencies associated with every sensing element to improve the identification accuracy.

It should be mentioned that although the above first and second embodiments are illustrated by concurrent driving, it is only intended to illustrate but not to limit the present disclosure. In the embodiment of the sequential driving, e.g., the drive circuit 22 sequentially driving the input channels (e.g., drive electrodes $D_1$-$D_n$), the encoding module 25 and the decoding module 26 are not implemented, and the detection end 2R sequentially generates a two-dimensional detection vector corresponding to each of the driving frequencies $f_1$-$f_N$ associated with each of the sensing elements $10_{11}$-$10_{nn}$. The detection end 2 is not necessary to generate the detection matrix Md as shown in FIG. 7 at first and then generate the two-dimensional detection vector by decoding. In the embodiment of the sequential driving, the detection end 2R still generates a plurality of two-dimensional detection vectors corresponding to each sensing element.

In this embodiment, the drive circuit 22 sequentially inputs a drive signal X(t) to each row of the sensing elements (or drive electrodes $D_1$-$D_n$), and the detection circuit 23 sequentially detects each column of the sensing elements (or receiving electrodes $S_1$-$S_n$) through the multiplexer 2am (or a plurality of switch devices $SW_1$-$SW_n$). As the encoding is not performed, the modulation module 26 modulates the drive signal X(t) using frequency division multiplexing to respectively output a modulated drive signal $X_1$-$X_n$ to each row of the sensing elements. Similarly, in this embodiment, each of the modulated drive signals $X_1$-$X_n$ contains a plurality of driving frequencies $f_1$-$f_N$ as shown in FIG. 10.

As the decoding is not performed, the detection circuit 23 is coupled to the capacitive sensing matrix 200 to respectively generate a two-dimensional detection vector corresponding to each of the driving frequencies $f_1$-$f_N$ according to a detection signal y(t) of each column of the sensing elements. As the drive end 2T sequentially drives each row of the sensing elements and the detection end 2R sequentially detects each column of the sensing elements, the above detection signal y(t) of each column of the sensing elements is associated with the detection result of one sensing element. Accordingly, the detection circuit 23 is able to directly output at most N (i.e. a number of driving frequencies) two-dimensional detection vectors corresponding to each sensing element.

In this embodiment, the detection circuit 23 modulates the detection signal y(t) using two mixing signals $MX_1$ and $MX_2$ to generate a pair of modulated detection signals $y_1$(t) and $y_2$(t), and filters the pair of modulated detection signals $y_1$(t) and $y_2$(t) to respectively generate a two-dimensional detection vector corresponding to each of the driving frequencies $f_1$-$f_N$ associated with each sensing element. As mentioned above, according to an oversampling frequency of the analog to digital converter 133, the detection circuit 23 further performs a downconversion on the pair of modulated detection signals $y_1$(t) and $y_2$(t).

In some embodiments, under different conditions (e.g., some frequencies having larger noises), it is possible that the capacitive touch system selects different driving frequencies to perform the driving without using all driving frequencies at the same time, e.g., comparing two-dimensional detection vectors corresponding to different driving frequencies to determine the better driving frequencies or driving frequencies not being used.

The capacitive touch system of the present disclosure includes a control chip and the capacitive sensing matrix 200, which is coupled to the control chip via the drive electrodes $D_1$-$D_n$ and the receiving electrodes $S_1$-$S_n$. The control chip includes the drive end 2T and the detection end 2R. In other words, the above driving the capacitive sensing matrix 200, receiving the detection signal y(t), mixing the detection signal y(t) using two mixing signal to generate a pair of modulated detection signals $y_1$(t) and $y_2$(t), calculating the norm of vector and identifying a touch may all be performed by the control chip.

In addition, as mentioned above, to increase a dynamic range of the analog-to-digital converter, in the second embodiment a phase shift is arranged between the drive signals of different input channels. In other words, it is possible to combine the first and second embodiments such that the drive signals of each input channel contain a plurality of driving frequencies and the drive signals between different input channels have a phase shift from each other.

In addition, although the above embodiment takes the capacitive sensing matrix 200 as an example for illustration, the present disclosure is not limited thereto. In other embodiments, the capacitive touch system of the present disclosure is also applicable to a capacitive touch sensing device including a single sensing element 10 (as the capacitive touch sensing device shown in FIG. 2). For example, the capacitive touch sensing device is used as a switching device to control the ON/OFF of an electronic device. In addition, it is possible that the capacitive touch sensing device includes more than one sensing element 10, and the more than one sensing elements 10 are not necessary to be arranged in a matrix. When the capacitive touch sensing device includes a plurality of sensing elements 10 arranged in rows and columns, a capacitive sensing matrix 200 is formed.

Accordingly, in this embodiment the capacitive touch sensing device includes an input channel coupled to the drive circuit 22 and an output channel coupled to the analog front end 2af and the digital backend 2db. If a single sensing element 10 is included, the multiplexer 2am may not be implemented.

The capacitive touch system of this embodiment includes a drive circuit, a capacitive touch sensing device, a modulation module and a detection circuit, wherein the capacitive touch sensing device includes, for example, a single sensing element or a plurality of sensing elements which form a single equivalent capacitor (self or mutual capacitor). The drive circuit outputs a drive signal, wherein the drive signal is used to drive the single sensing element or the single equivalent capacitor. The capacitive touch sensing device includes at least one sensing element. The modulation module is used to modulate the drive signal using frequency division multiplexing to output a modulated drive signal to the at least one sensing element, wherein the modulated drive signal contains a plurality of driving frequencies (as shown in FIG. 10). The detection circuit is coupled to the capacitive touch sensing device and used to respectively generate a two-dimensional detection vector corresponding to each of the driving frequencies according to a detection signal from the at least one sensing element.

In this embodiment, the capacitive touch sensing device of the capacitive touch system is also used to detect a capacitance variation to identify whether an object approaches or touches the capacitive touch sensing device. The operating method of this embodiment is similar to the previous embodiment, and the difference is that the drive circuit 22 drives at least one sensing element and the detection circuit 23 detects a detection signal y(t) of the at least one sensing element. The post-processing performed by the digital backend 2db on the detection signal y(t) has been illustrated above, and thus details thereof are not repeated herein.

In another embodiment, the above first electrode 101 is, for example, the drive electrode of a touch keyboard used as an input device, and the above second electrode 102 is, for example, the receiving electrode of the touch keyboard. The objective of reducing the noise interference, power consumption and detection interval is achieved by using the encoding and modulation of FIGS. 6-7 (e.g., QAM) or the frequency division multiplexing of FIGS. 8-10.

In other words, the above capacitive touch system includes a touch keyboard, and each push button (referring FIG. 12 for example) of the touch keyboard is arranged with at least one sensing element 10. In this embodiment, each push button of the touch keyboard is arranged to correspond to at least one sensing element 10 of the above capacitive sensing matrix (e.g., when one push button is corresponded to multiple sensing elements, capacitance variation associated with the one push button being a sum or average of capacitance variations of the multiple sensing elements), but operations of the drive end 2T and the detection end 2R are not changed to achieve identical effects.

Figure 12:
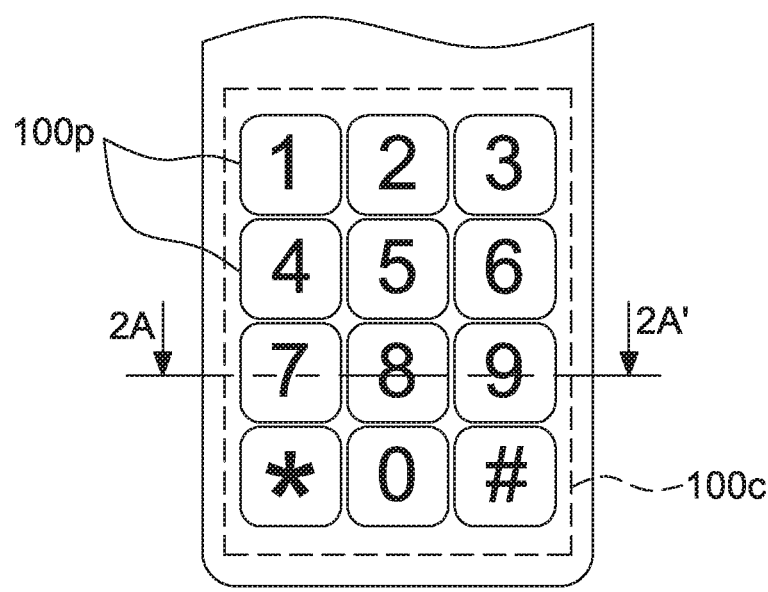
FIG. 12 is a schematic diagram of an input device according to one embodiment of the present disclosure.

Referring to FIG. 12, it is a schematic diagram of an input device according to one embodiment of the present disclosure. For example, the input device 100 is a touch keyboard, which is within a touch control area 100c, of a portable electronic device. A user may input characters such as a symbol, a number or a letter to be shown on a display or control the operation of application software through a plurality of push buttons 100p. It should be mentioned that the input device 100 of the present disclosure is not limited to be adapted to portable electronic devices, and is adaptable to any electronic system which interacts with users via a keyboard module.

Figure 13:
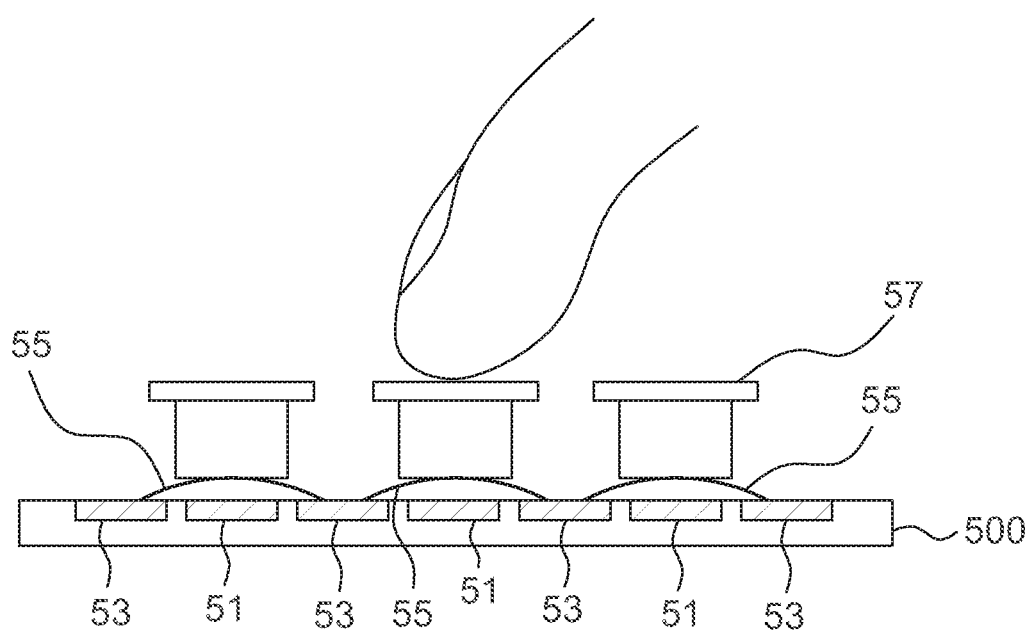
FIG. 13 is a cross sectional view of the input device taken along line 2A-2A' in FIG. 12.

Referring to FIG. 13, it is a cross sectional view of the input device 100 taken along line 2A-2A' in FIG. 12. The input device 100 includes a substrate 500 and a plurality of push buttons 57 (e.g., twelve push buttons shown in FIG. 12). The push buttons 57 are made of, for example, acrylic material, glass material or plastic material. The push buttons 57 are separated from one another or connected together via a connecting structure. The push buttons 57 may be manufactured by conventional methods without particular limitations as long as each of the push buttons 57 includes a key cap for being pressed by users and a pillar connected to the key cap.

The substrate 500 is, for example, a printed circuit board (PCB) or a flexible board for disposing circuits and electronic elements. A plurality of patterned first electrodes 51 and a plurality of patterned second electrodes 53 are formed on the substrate 500 to generate the inductive capacitor therebetween. The first electrodes 51 and the second electrodes 53 are formed, e.g., by the same manufacturing procedure, at the same layer of the substrate 500, but not limited to. It is possible that the first electrodes 51 and the second electrodes 53 are at different layers of the substrate 500. A plurality of elastic pads 55 are further formed on the substrate 500 and electronically connected two adjacent second electrodes 53. The elastic pads 55 are, for example, metal dome pads or metal snap domes to respectively push against the pillars of the push buttons 57. Accordingly, if an external force presses on the key cap of one of the push buttons 57, the pillar of the one push button 57 applies force on the corresponding elastic pad 55 to deform the elastic pad 55. When the external force disappears, the deformed elastic pad 55 recovers to its original state or position.

In the present disclosure, although the material and the shape of the elastic pads 55 are not particularly limited, the elastic pads 55 are preferably conductors since the elastic pads 55 are also used as receiving electrodes of the capacitive detection.

In some embodiments, the elastic pads 55 do not directly push against the push buttons 57. For example, the elastic pads 55 are fixed on the substrate 500 by an elastic layer, i.e. an elastic layer being sandwiched between the elastic pads 55 and the pillars of the push buttons 57. The elastic layer has functions of both fixing the elastic pads 55 and buffering between the elastic pads 55 and the pillars of the push buttons 57. It is possible to fix the elastic pads 55 on the substrate 500 using conventional methods without particular limitations as long as the top of the elastic pads 55 directly or indirectly pushes again the push buttons 57 and the elastic pads 55 are used as the connecting bridge of the second electrodes 53.

Figure 14:
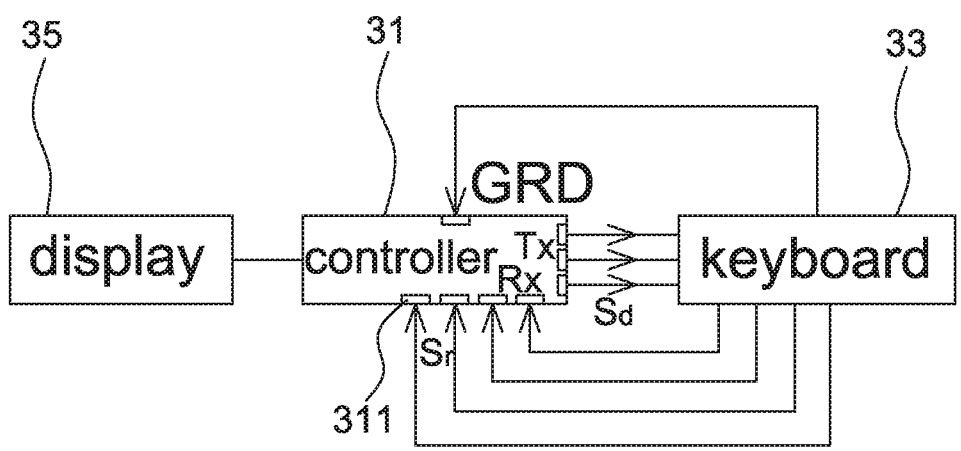
FIG. 14 is a schematic block diagram of an input device according to one embodiment of the present disclosure.

Referring to FIG. 14, it is a schematic block diagram of an input device according to one embodiment of the present disclosure. In some aspects, the input device 100 includes a controller 31 and a keyboard module 33 electrically connected together via at least one bus bar. In some aspects, the input device 100 further includes a display 35 electrically connected to the controller 31. In some aspects, the display 35 is not included in the input device 100 but electrically coupled to the controller 31 in a wired manner. In some aspects, the input device 100 includes the keyboard module 33 without the controller 31, and the controller 31 is included in a host (not shown), such as a computer system which is wired or wirelessly connected to the keyboard module 33.

The controller 31 is, for example, a control chip, a central processing unit, a microcontroller or an application specific integrated circuit (ASIC) which receives a detected signal Sr from the keyboard module 33 to perform corresponding controls, e.g., performing a push-button input control and/or a touch input control. The push-button input control is, for example, to show characters on the display 35 inputted from the push buttons. The touch input control includes, for example, at least one of a gesturing control, a scrolling control, a zooming control, a clicking control and a cursor control. The push-button input control and the touch input control are implemented by software, hardware, firmware or a combination thereof.

For example, the controller 31 includes a plurality of pins 311 electrically connecting to the keyboard module 33 via the bus bar. For example, the controller 31 includes drive pins coupled to a drive end (Tx, e.g., drive end 2T mentioned above) for inputting the drive signal Sd to the keyboard module 33, and includes detection pins coupled to a receiving end (Rx, e.g., detection end 2R mentioned above) for receiving the detected signal Sr from the keyboard module 33. In some embodiments, the controller 31 further includes a ground pin GRD connected to ground electrodes of the keyboard module 33 (described hereinafter), wherein whether the ground pin GRD is included is determined according to different applications.

The drive signal Sd is, for example, a continuous signal (e.g., sinusoidal wave) or a digital signal without particular limitations. The controller 31 identifies the capacitance variation according to the detected signal Sr (e.g., according to the voltage variation, frequency variation, variation of charging and discharging time intervals) to identify the user operation and perform the corresponding control. The method of identifying the capacitance variation may use the above mentioned method, but not limited thereto.

Figure 15A:
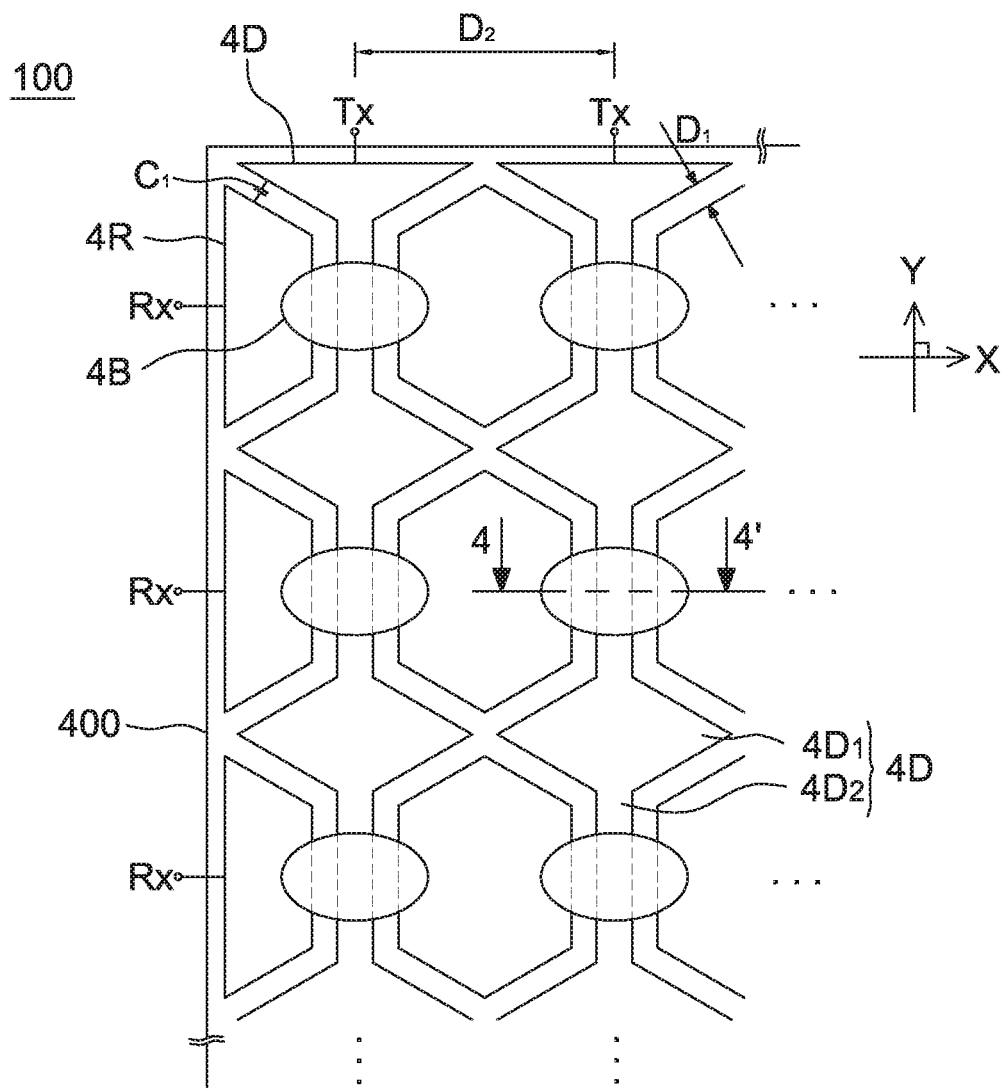
FIG. 15A is a schematic diagram of the electrode arrangement of an input device according to one embodiment of the present disclosure.
Figure 15B:
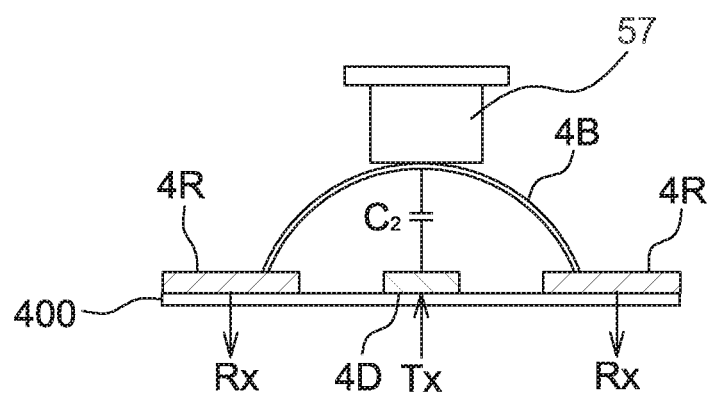
FIG. 15B is a cross sectional view of the input device taken along line 4-4' in FIG. 15A in which a push button is shown not being pressed.

Referring to FIGS. 15A and 15B, FIG. 15A is a schematic diagram of the electrode arrangement of an input device according to one embodiment of the present disclosure, and FIG. 15B is a cross sectional view of the input device taken along line 4-4' in FIG. 15A which shows a push button not being pressed.

The input device 100 of this embodiment includes a substrate 400, a first electrode group, a second electrode group, a plurality of elastic pads 4B and a plurality of push buttons 57, wherein each of the push buttons 57 is opposite to one of the elastic pads 4B. The elastic pads 4B are conductive and deformable due to the external force of the push buttons 57 to change a value of the inductive capacitor.

As mentioned above, the elastic pads 4B are metal dome pads or metal snap domes. The substrate 400 is, for example, a PCB or a flexible board.

The first electrode group includes a plurality of first electrodes 4D formed on the substrate 400. For example, the first electrodes 4D are patterned electrodes formed by the photolithography process. Each of the first electrodes 4D extends along a first direction (e.g., Y direction) of the substrate 400. In this embodiment, the first electrodes 4D are used as, for example, drive electrodes and electrically coupled to the drive end Tx of the controller 31 (as shown in FIG. 14). Each of the first electrodes 4D includes a plurality of main body parts 4D1 and a plurality of connecting parts 4D2, and each of the connecting parts 4D2 connects two main body parts 4D1 in the first direction of the substrate 400. It should be mentioned that although FIG. 15A shows the main body parts 4D1 having a triangular shape or a diamond shape, it is only intended to illustrate but not to limit the present disclosure. It is possible to form the main body parts 4D1 as other shapes, e.g., a circle, a semicircle, a trapezoid, a rectangle or a polygon without particular limitations.

The second electrode group includes a plurality of second electrodes 4R separately formed on the substrate 400. For example, the second electrodes 4R are patterned electrodes formed by the photolithography process. The first electrodes 4D and the second electrodes 4R are formed by the same photolithography process and at the same layer of the substrate 400, but not limited to. It is possible that the first electrodes 4D and the second electrodes 4R are formed by different photolithography processes and at different layers of the substrate 400. In this embodiment, the second electrodes 4R are, for example, used as receiving electrodes and electrically coupled to the receiving end Rx of the controller 31 (as shown in FIG. 14). It should be mentioned that although FIG. 15A shows the second electrodes 4R having a trapezoidal shape or a hexagonal shape, it is only intended to illustrate but not to limit the present disclosure. It is possible to form the second electrodes 4R as other shapes, e.g., a circle, a semicircle, a rectangle, a triangle or a polygon without particular limitations. As shown in FIG. 15A, each of the second electrodes 4R are separated by the first electrodes 4D in a second direction (e.g., X direction) without being connected to each other.

In other embodiments, the first electrodes 4D are used as receiving electrodes, while the second electrodes 4R are used as drive electrodes. In other embodiments, the first electrodes 4D extend along the second direction (e.g., X direction), while the second electrodes 4R extend along the first direction (e.g., Y direction). In some embodiments, a number of the first electrodes 4D is equal to a number of rows or a number of columns of the push buttons 57, and a number of rows of the second electrodes 4R (each row having multiple second electrodes) is equal to a number of rows or a number of columns of the push buttons 57.

Each of the elastic pads 4B crosses over, e.g., forming an arch bridge structure, one of the first electrodes 4D in the second direction of the substrate 400 to electrically connect two second electrodes 4R at two sides of the first electrode 4D crossed by said each of the elastic pads 4B. More specifically, the elastic pads 4B have a predetermined distance in a vertical direction from the first electrodes 4D to provide a deforming space for the elastic pads 4B. As mentioned above, each of the first electrodes 4D has a plurality of connecting parts 4D2 for connecting two main body parts 4D1, and the width (e.g., a width in the second direction) of the connecting parts 4D2 is preferable smaller than that of the main body parts 4D1 to allow each of the elastic pads 4B to be able to cross over one of the connecting parts 4D2 with a smaller distance in the second direction (e.g., X direction) of the substrate 400 to electrically connect two second electrodes 4R at two sides of the connecting part 4D2 crossed by said each of the elastic pads 4B. A shape of the elastic pads 4B is not limited to an ellipse. It is possible to form the elastic pads 4B as a circle or other shapes without particular limitations. The size of the elastic pads 4B is arranged corresponding to the push buttons 57. In other embodiments, the first electrodes 4D have an identical width in the first direction (e.g., Y direction).

In the present disclosure, the first electrode group receives a drive signal Sd (e.g., the modulated drive signal, or the encoded and modulated drive signal mentioned above) from the drive end Tx to form a first inductive capacitor C1 between the first electrodes 4D and the second electrodes 4R. As shown in FIG. 15A, a distance between the first electrodes 4D and the second electrodes 4R is, for example, D1, and a value of the first inductive capacitor C1 is determined according to the distance D1, the drive signal Sd, the shape/area of the first electrodes 4D and the second electrodes 4R. For example, edges of the first electrodes 4D and the second electrodes 4R are not straight lines but zig-zag edges. A distance between two adjacent first electrodes 4D is shown as D2 which corresponds to the row distance or column distance of the push buttons 57. In addition, when a conductor (e.g., a finger) approaches to the substrate 400 (or the keyboard module 33), the first inductive capacitor C1 generates a first capacitance variation.

In addition, a second inductive capacitor C2 (e.g., sensing element mentioned above) is formed between each of the elastic pads 4B and the first electrode 4D crossed by said each of the elastic pads 4B, as shown in FIG. 15B. When the elastic pads 4B are pressed by an external force F to deform (as shown in FIG. 16B), the second inductive capacitor C2 generates a second capacitance variation (e.g., from C2 to C2').

Accordingly, when the push buttons 57 are not pressed, the elastic pads 4B and the second electrodes 4R are taken as one electrode, and the first capacitor C1 formed between the above electrode (i.e. elastic pads 4B and the second electrodes 4R) and the first electrodes 4D is influenced by an external conductor (e.g., a finger) to generate the first capacitance variation such that a detected signal Sr is outputted to the controller 31 (as shown in FIG. 14). The controller 31 then identifies a touch input, for example one of a gesturing control, a scrolling control, a zooming control, a clicking control and a cursor control, but not limited to, according to the detected signal Sr corresponding to the first capacitance variation (e.g., position variation or variation of touch times).

When the push buttons 57 are pressed, the second capacitor C2 formed by the elastic pad 4B corresponding to the pressed push button and the first electrode 4D (e.g., connecting part 4D2 thereof) below the elastic pad 4B generates the second capacitance variation due to a distance variation between the elastic pad 4B and the first electrode 4D. For example, the distance between the elastic pad 4B and the first electrode 4D in FIG. 16B is smaller than that in FIG. 15B such that the capacitance is increased. The controller 31 then identifies a push-button input according to a detected signal Sr corresponding to the second capacitance variation. The controller 31 is able to identify the second capacitance variation corresponding to different push buttons 57 to recognize which of the push buttons 57 is pressed to output a corresponding control signal, e.g., showing a corresponding character on a display 35.

In addition, to protect the first electrodes 4D and the second electrodes 4R from oxidation and scratches as well as for isolation, the substrate 400 further has an isolation layer 4P (e.g., the areas filled with slant lines in FIG. 16A) covering on the first electrode group and a part of the second electrode group, wherein each of the second electrodes 4R of the second electrode group has a contact zone 4R1 electrically contacting the elastic pads 4B and not covered by the isolation layer 4P.

Figure 16A:
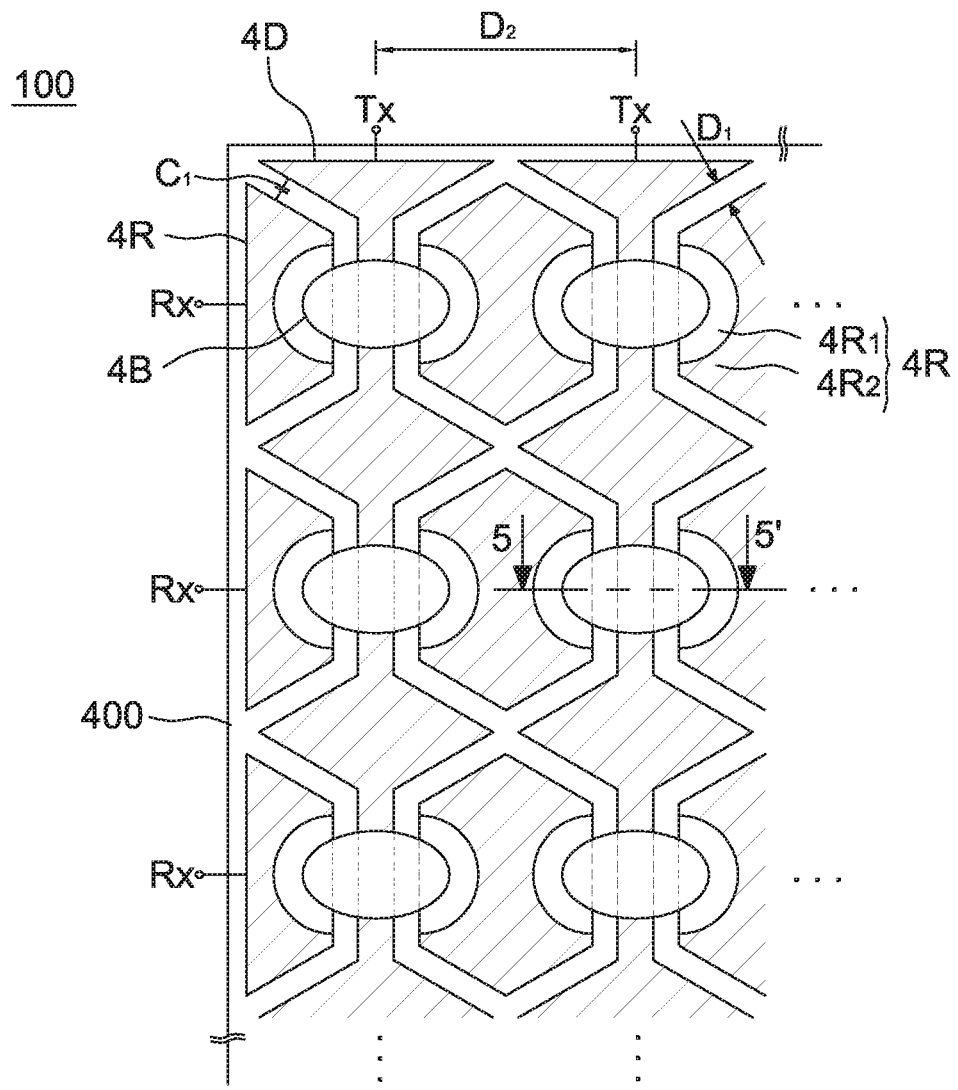
FIG. 16A is a schematic diagram of forming an isolation layer on electrodes of the input device in FIG. 15A.
Figure 16B:
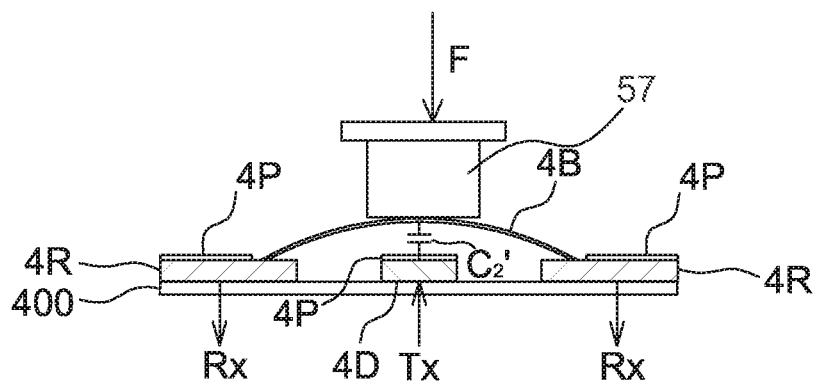
FIG. 16B is a cross sectional view of the input device taken along line 5-5' in FIG. 16A in which a push button is shown being pressed.

It should be mentioned that although FIGS. 16A and 16B show that the isolation layer 4P is formed only on the first electrodes 4D and coating zones 4R2 of the second electrodes 4R, it is only intended to illustrate but not to limit the present disclosure. It is possible to form the isolation layer 4P on all areas of the substrate 400 only not on the contact zones 4R1 of the second electrodes 4R. It is possible to form the isolation layer 4P on the substrate 400 using conventional methods without particular limitations.

Figure 17A:
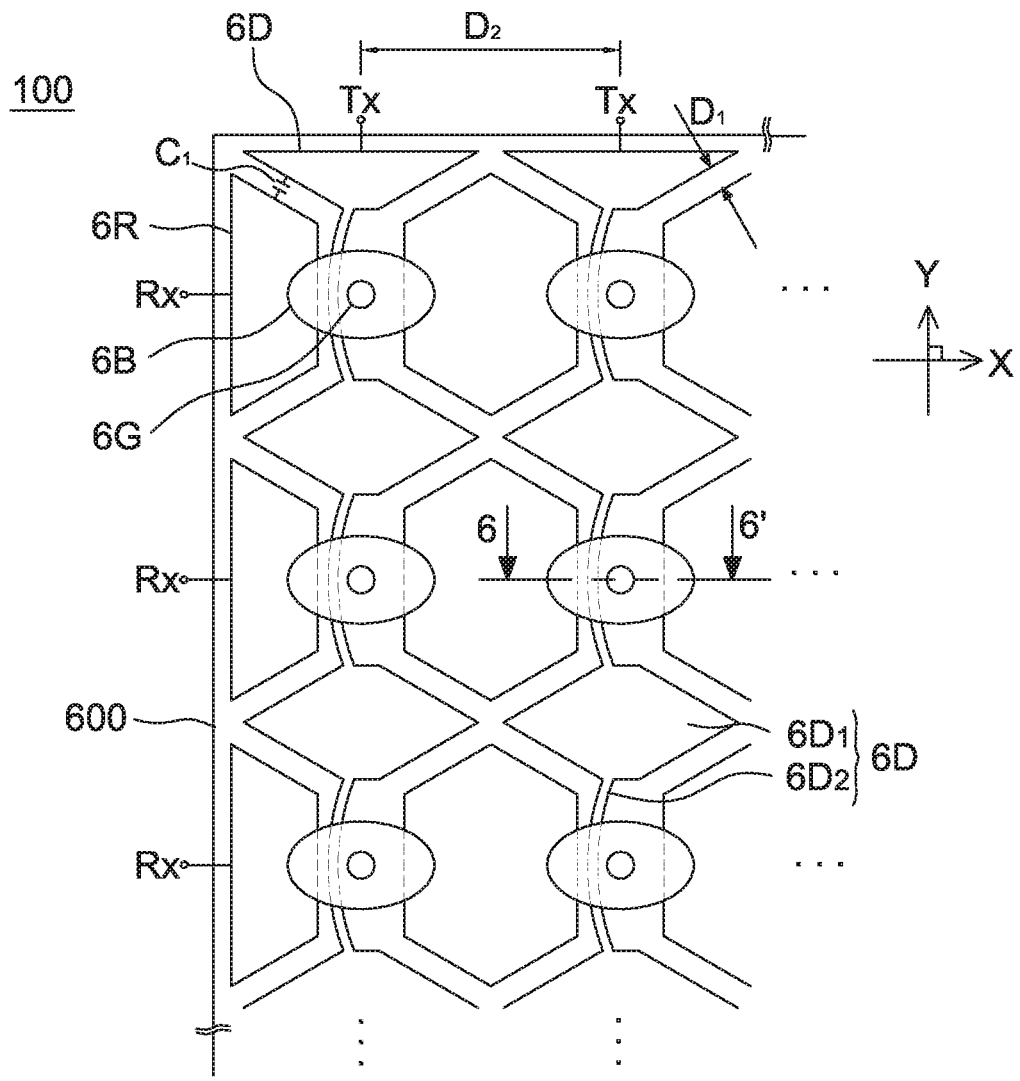
FIG. 17A is a schematic diagram of the electrode arrangement of an input device according to another embodiment of the present disclosure.
Figure 17B:
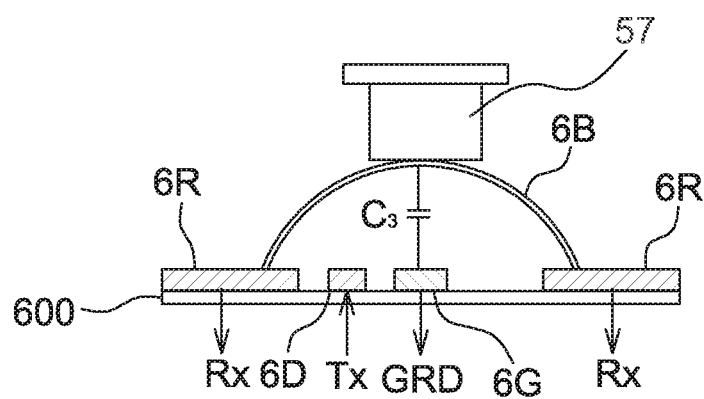
FIG. 17B is a cross sectional view of the input device taken along line 6-6' in FIG. 17A in which a push button is shown not being pressed.

Referring to FIGS. 17A and 17B, FIG. 17A is a schematic diagram of the electrode arrangement of an input device according to another embodiment of the present disclosure, and FIG. 17B is a cross sectional view of the input device taken along line 6-6' in FIG. 17A showing a push button 57 not being pressed.

The input device of this embodiment includes a substrate 600, a first electrode group, a second electrode group, a plurality of elastic pads 6B, a plurality of ground electrodes 6G and a plurality of push buttons 57, wherein each of the push buttons 57 is opposite to one of the elastic pads 6B. The elastic pads 6B are conductive and deformable due to the external force from the push buttons 57. As mentioned above, the elastic pads 6B are metal dome pads or metal snap domes. The substrate 600 is, for example, a PCB or a flexible board.

The first electrode group includes a plurality of patterned first electrodes 6D formed on the substrate 600. Each of the first electrodes 6D extends along a first direction (e.g., Y direction) of the substrate 600. In this embodiment, the first electrodes 6D are used as, for example, drive electrodes and electrically coupled to the drive end Tx of the controller 31 (as shown in FIG. 14). Each of the first electrodes 6D includes a plurality of main body parts 6D1 and a plurality of connecting parts 6D2, and each of the connecting parts 6D2 connects two main body parts 6D1 in the first direction of the substrate 600. It should be mentioned that although FIG. 17A shows the main body parts 6D1 having a triangular shape or a diamond shape, it is only intended to illustrate but not to limit the present disclosure. It is possible to form the main body parts 6D1 as other shapes, e.g., a circle, a semicircle, a trapezoid, a rectangle or a polygon without particular limitations. It should be mentioned that although FIG. 17A shows that two main body parts 6D1 are connected by one connecting part 6D2, it is only intended to illustrate but not to limit the present disclosure. In other embodiments, two main body parts 6D1 are connected by at least two connecting parts 6D2 without particular limitations.

The second electrode group includes a plurality of patterned second electrodes 6R separately formed on the substrate 600. The first electrodes 6D and the second electrodes 6R are formed by the same photolithography process and at the same layer of the substrate 600, but not limited to. In this embodiment, the second electrodes 6R are, for example, used as receiving electrodes and electrically coupled to the receiving end Rx of the controller 31 (as shown in FIG. 14). It should be mentioned that although FIG. 17A shows the second electrodes 6R having a trapezoidal shape or a hexagonal shape, it is only intended to illustrate but not to limit the present disclosure. It is possible to form the second electrodes 6R as other shapes, e.g., a circle, a semicircle, a rectangle, a triangle or a polygon without particular limitations. As shown in FIG. 17A, each of the second electrodes 6R is separated by the first electrodes 6D in a second direction (e.g., X direction) without being connected to each other.

The arrangements of the first electrode group, the second electrode group and the elastic pads of the embodiments of FIGS. 15A and 17A are substantially identical only the embodiment of FIG. 17A further including a plurality of ground electrodes 6G separately formed on the substrate 600. The ground electrodes 6G are also formed by a photolithography process, and formed together with the first electrode group and the second electrode group using the same manufacturing process, but not limited thereto. In other embodiments, a part of the first electrode group, the second electrode group and the ground electrodes 6G are at different layers of the substrate 600.

Each of the elastic pads 6B crosses over one of the first electrodes 6D and one of the ground electrodes 6G in the second direction of the substrate 600 to electrically connect two second electrodes 6R at two sides of the first electrode 6D crossed by said each of the elastic pads 6B. As mentioned above, each of the first electrodes 6D has a plurality of connecting parts 6D2 for connecting two main body parts 6D1, and the width (e.g., a width in the second direction) of the connecting parts 6D2 is preferable much smaller than that of the two main body parts 6D1 to allow each of the elastic pads 6B to be able to cross over one of the connecting parts 6D2 and one of the ground electrodes 6G along the second direction of the substrate 600 to electrically connect two second electrodes 6R at two sides of the connecting part 6D2 crossed by said each of the elastic pads 6B. Similarly, a shape of the elastic pads 6B is not limited to an ellipse. It is possible to form the elastic pads 6B as a circle or other shapes without particular limitations. Each of the ground electrodes 6G is preferably opposite to a central position of each of the elastic pads 6B. In other words, one push button 57, one elastic pad 6B and one ground electrode 6G are aligned with each other in a vertical direction (e.g., a norm of the substrate 600).

In the present disclosure, the first electrode group receives a drive signal Sd from the drive end Tx to form a first inductive capacitor C1 between the first electrodes 6D and the second electrodes 6R. As shown in FIG. 17A, a distance between the first electrodes 6D and the second electrodes 6R is, for example, D1, and a value of the first inductive capacitor C1 is determined according to the distance D1, the drive signal Sd, the shape/area of the first electrodes 6D and the second electrodes 6R. Similarly, edges of the first electrodes 6D and the second electrodes 6R may not be straight lines but zig-zag edges. A distance between two adjacent first electrodes 6D is shown as D2 which corresponds to the row distance or column distance of the push buttons 57.

In addition, a second inductive capacitor C3 (e.g., sensing element mentioned above) is formed between each of the elastic pads 6B and the ground electrode 6D crossed by said each of the elastic pads 6B, as shown in FIG. 17B. When the elastic pads 6B are pressed by an external force F to deform (as shown in FIG. 18B), the second inductive capacitor C3 generates a second capacitance variation (e.g., from C3 to C3'). When a conductor (e.g., a finger) approaches to the substrate 600 (or the keyboard module 33), the first inductive capacitor C1 generates a first capacitance variation (e.g., capacitance decreasing). In this embodiment, as the second inductive capacitor C3 is mainly formed between the ground electrodes 6G and the elastic pads 6B, a better stability is realized. In this embodiment, as the connecting parts 6D2 of the first electrodes 6D are not mainly used to induct the second capacitance variation with the elastic pads 6B, the width of the connecting parts 6D2 of the first electrodes 6D may be formed narrower as long as two main body parts 6D1 are electrically connected thereby. In some embodiments, it is possible to arrange the width of the connecting parts 6D2 of the first electrodes 6D identical to that in the embodiment of FIG. 15A to form another inductive capacitor with the elastic pads 6B.

Accordingly, when the push buttons 57 are not pressed, the elastic pads 6B and the second electrodes 6R are taken as one electrode, and the first capacitor C1 formed between the above electrode (i.e., elastic pads 6B and second electrodes 6R) and the first electrodes 6D is influenced by an external conductor (e.g., a finger) to generate the first capacitance variation such that a detected signal Sr is outputted to the controller 31 (as shown in FIG. 14). The controller 31 then identifies a touch input, for example one of a gesturing control, a scrolling control, a zooming control, a clicking control and a cursor control, according to the detected signal Sr.

When the push buttons 57 are pressed, the second capacitor C3 formed between the elastic pad 6B corresponding to the pressed push button and the ground electrode 6G below the elastic pad 6B generates the second capacitance variation due to a distance change between the elastic pad 6B and the ground electrode 6D. For example, the distance between the elastic pad 6B and the ground electrode 6G in FIG. 18B is smaller than that in FIG. 17B such that the capacitance is increased. The controller 31 identifies a push-button input according to a detected signal Sr, and the controller 31 is able to distinguish the second capacitance variation corresponding to different push buttons 57 to recognize which of the push buttons 57 is pressed to output a corresponding control signal, e.g., showing a corresponding character on a display 35.

Similarly, to protect the first electrodes 6D, the second electrodes 6R and the ground electrodes 6G from oxidation and scratches as well as for isolation, the substrate 600 further has an isolation layer 6P (e.g., the areas filled with slant lines in FIG. 18A) covering on the first electrode group, the ground electrodes 6G and a part of the second electrode group, wherein each of the second electrodes 6R of the second electrode group has a contact zone 6R1 electrically contacting the elastic pads 6B and not covered by the isolation layer 6P.

Figure 18A:
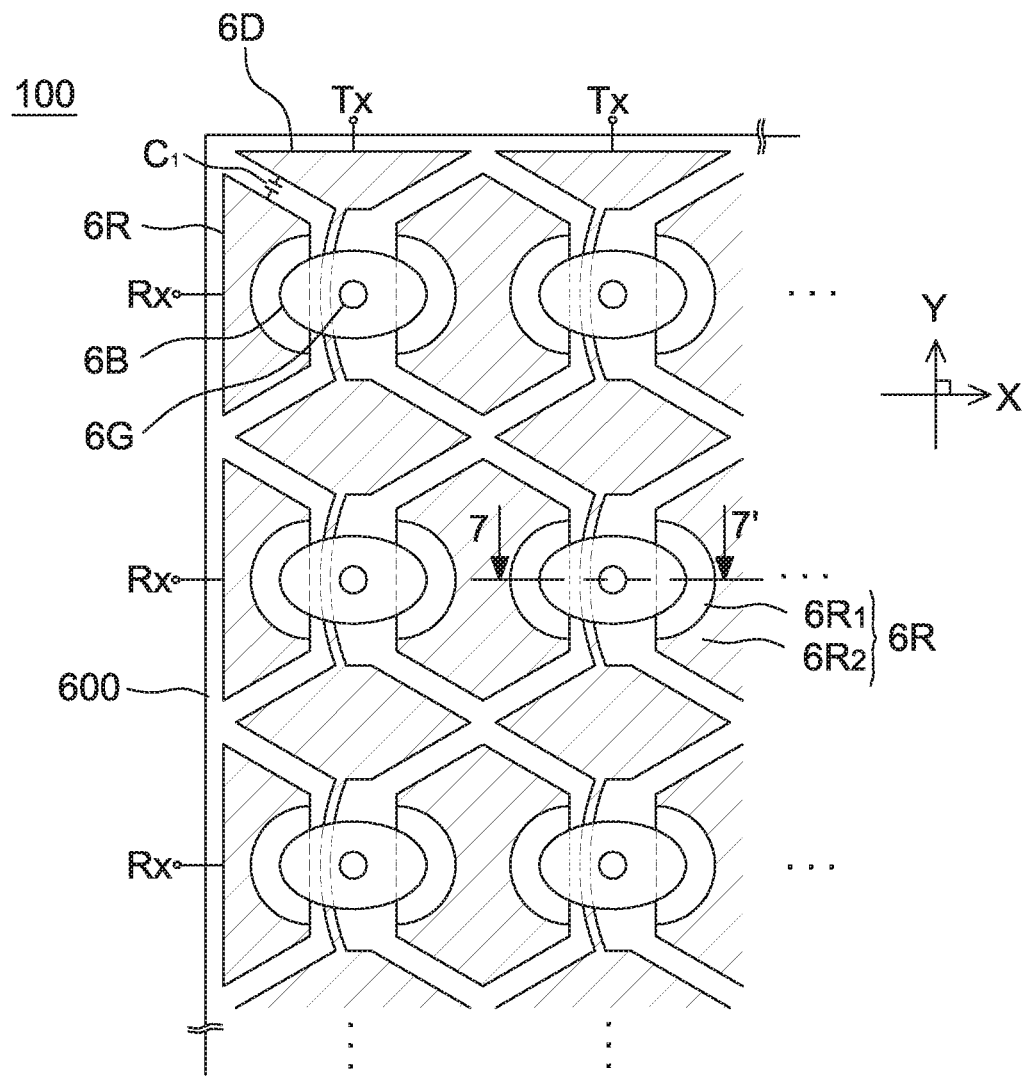
FIG. 18A is a schematic diagram of forming an isolation layer on electrodes of the input device in FIG. 17A.
Figure 18B:
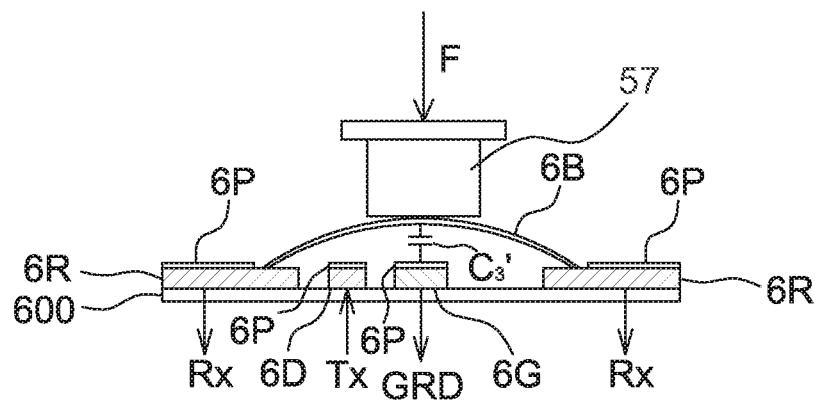
FIG. 18B is a cross sectional view of the input device taken along line 7-7' in FIG. 18A in which a push button is shown being pressed.

It should be mentioned that although FIGS. 18A and 18B show that the isolation layer 6P is formed only on the first electrodes 6D, the ground electrodes 6G and the coating zones 6R2 of the second electrodes 6R, it is only intended to illustrate but not to limit the present disclosure. It is possible to form the isolation layer 6P on all areas of the substrate 600 only not on the contact zones 6R1 of the second electrodes 6R. It is possible to form the isolation layer 6P on the substrate 600 using conventional methods without particular limitations.

It should be mentioned that although the modulation in FIG. 8 is shown to have multiple driving frequencies $f_1$-$f_N$ at every channel, the present disclosure is not limited thereto. In other aspects, the modulation (including both the encoding and non-encoding cases) of the drive end 2T of the touch keyboard is to use a single driving frequency at every channel (defined as above), and the detection end 2R is only arranged with the bandpass filter corresponding to the single modulation frequency such that each channel outputs one detection signal y(t) corresponding to one push button. The touch or press of the push button is identified using the detection circuit 23 of FIG. 9. For example, two thresholds are set when FIG. 4 is used, and if the norm of vector associated with the detection signal y(t) is smaller than a first threshold (or variation of the norm of vector larger than a first variation threshold), a touch is identified; whereas if the norm of vector associated with the detection signal y(t) is smaller than a second threshold (or variation of the norm of vector larger than a second variation threshold), a press is identified. For example, the second threshold is smaller than the first threshold, and the second variation threshold is larger than the first variation threshold, but the not limited thereto.

For example, multiple push buttons in FIG. 12 are arranged in a matrix, and each push button corresponds to one sensing element. The drive electrode 22 outputs a drive signal X(t) to the sensing elements at each row. Referring to FIGS. 8 and 9, the encoding module 25 encodes the drive signal X(t) corresponding to each row of the sensing elements to output a plurality of encoded drive signals Xc(t). The modulation module 26 modulates the encoded drive signals Xc(t) and concurrently outputs encoded and modulated drive signals X1 to Xn to each row of the sensing elements, wherein each of the encoded and modulated drive signals X1 to Xn contains a single driving frequency. The detection circuit 23 is coupled to the multiple sensing elements and used to respectively generate a detection matrix according to a detection signal of each column of the sensing elements. The decoding module 27 decodes the detection matrices to output a two-dimensional detection vector corresponding to each of the sensing elements.

In brief, this aspect is to select one frequency among the multiple driving frequencies $f_1$-$f_N$ shown in FIGS. 8-9 to perform the modulation, and the selected driving frequencies corresponding to every row of the sensing elements are identical to or different from one another.

In the aspect that the encoding is not performed, the encoding module 25 and the decoding module 27 are not implemented.

In addition, the modulation techniques adaptable to the touch keyboard of the present disclosure includes one or a combination of conventional modulation methods including the encoded modulation, the frequency modulation, the amplitude modulation, the phase modulation or the like without particular limitations as long as the detection circuit 13 is able to identify the touch or press based on FIG. 4 after the norm of vector of the detection signal y(t) is obtained.

As mentioned above, when capacitive sensors are applied to different electronic devices, they are interfered by noises of the electronic devices to degrade the detection accuracy. Therefore, the present disclosure further provides a capacitive touch system (FIGS. 7-9) and an operating method thereof (FIGS. 11) that input a mixed signal containing a plurality of driving frequencies into each input channel modulated by frequency division multiplexing to overcome the noise interference and improve the detection accuracy as well as reducing the power consumption and shortening the detection time interval.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A touch keyboard, comprising:
multiple push buttons arranged in rows and columns, each of the push buttons corresponding to one sensing element among a plurality of sensing elements;
a control chip coupled to the sensing elements and configured to output a drive signal,
    encode the drive signal corresponding to each row of the sensing elements to output a plurality of encoded drive signals,
    modulate the encoded drive signals and concurrently output encoded and modulated drive signals to the rows of the sensing elements, wherein each of the encoded and modulated drive signals outputted to a corresponding row among the rows of the sensing elements contains a plurality of driving frequencies, and the encoded and modulated drive signals on all the rows of the sensing elements concurrently contain identical driving frequencies,
    respectively generate a detection matrix corresponding to each of the driving frequencies according to a detection signal of each column of the sensing elements to obtain a plurality of detection matrices corresponding to each column of the sensing elements, wherein the control chip is configured to modulate the detection signal with two mixing signals to generate a pair of modulated detection signals, and
    filter, using multiple digital filters, the pair of modulated detection signals associated with each column of the sensing elements to respectively generate the detection matrix corresponding to each of the driving frequencies, wherein passbands of the multiple digital filters used for all columns of the sensing elements are identical and corresponding to all the identical driving frequencies, and
    decode the detection matrices to output a plurality of two-dimensional detection vectors corresponding to each of the sensing elements, wherein the two-dimensional detection vectors associated with each of the sensing elements respectively correspond to the driving frequencies.

2. The touch keyboard as claimed in claim 1, wherein the control chip is further configured to perform a downconversion on the pair of modulated detection signals.

3. The touch keyboard as claimed in claim 2, wherein the control chip further comprises an analog to digital converter configured to digitize the detection signal using an oversampling.

4. The touch keyboard as claimed in claim 1, wherein the control chip further comprises a processor configured to respectively calculate a norm of vector of the two-dimensional detection vectors.

5. The touch keyboard as claimed in claim 1, wherein the control chip is further configured to phase-modulate the encoded drive signals corresponding to the rows of the sensing elements to cause the encoded and modulated drive signals corresponding to different rows of the sensing elements to have a phase difference therebetween.

6. The touch keyboard as claimed in claim 1, wherein the control chip is configured to encode the drive signal with a Hadamard matrix, and decode the detection matrices with an inverse matrix of the Hadamard matrix.

7. The touch keyboard as claimed in claim 1, wherein the control chip is configured to modulate the encoded drive signals using frequency division multiplexing.

8. The touch keyboard as claimed in claim 1, wherein the control chip is configured to modulate the encoded drive signals using orthogonal frequency division multiplexing.

9. The touch keyboard as claimed in claim 1, wherein a frequency difference between the driving frequencies is 50 KHZ to 150 KHZ.

10. A touch keyboard, comprising:
multiple push buttons arranged in rows and columns, each of the push buttons corresponding to one sensing element among a plurality of sensing elements;
a control chip coupled to the sensing elements and configured to output a drive signal,
    encode the drive signal corresponding to each row of the sensing elements to output encoded drive signals,
    modulate the encoded drive signals corresponding to each row of the sensing elements to concurrently output encoded and modulated drive signals to each row of the sensing elements,
    respectively generate a detection matrix according to a detection signal of each column of the sensing elements, and
    decode the detection matrices to output a two-dimensional detection vector corresponding to each of the sensing elements;
a substrate;
a first electrode group, a second electrode group and a plurality of ground electrodes arranged at a same level on the substrate, wherein
    the first electrode group comprises at least one first electrode formed on the substrate, the at least one first electrode extending along a first direction of the substrate,
    the second electrode group comprises a plurality of second electrodes, wherein the plurality of second electrodes are arranged as multiple separated rows, and each of said multiple separated rows includes multiple second electrodes separately arranged along a second direction of the substrate, and
    the plurality of ground electrodes are separately formed on the substrate, wherein each of the plurality of ground electrodes is respectively arranged between two adjacent second electrodes in one of said multiple separated rows; and
a plurality of elastic pads each crossing over the at least one first electrode and one of the ground electrodes along the second direction of the substrate to electrically contact the two adjacent second electrodes in one of said multiple separated rows and at two sides of the first electrode crossed thereby, wherein each of the ground electrodes and a corresponding elastic pad is configured to form one of the sensing elements.

11. The touch keyboard as claimed in claim 10, wherein the control chip is configured to
    modulate the detection signal with two mixing signals to generate a pair of modulated detection signals; and
    accumulate the pair of modulated detection signals to generate the detection matrix.

12. The touch keyboard as claimed in claim 10, wherein the control chip is configured to encode the drive signal with a Hadamard matrix, and decode the detection matrices with an inverse matrix of the Hadamard matrix.

13. The touch keyboard as claimed in claim 10, wherein the control chip further comprises an analog to digital converter configured to convert the detection signal to a digital detection signal.

14. The touch keyboard as claimed in claim 10, wherein the control chip is configured to perform phase modulation, or phase and amplitude modulation.

15. A touch keyboard, comprising:
multiple push buttons arranged in rows and columns, each of the push buttons corresponding to one sensing element among a plurality of sensing elements;
a control chip coupled to the sensing elements and configured to output a drive signal,
encode the drive signal corresponding to each row of the sensing elements to output a plurality of encoded drive signals,
modulate the encoded drive signals and concurrently output encoded and modulated drive signals to each row of the sensing elements, wherein each of the encoded and modulated drive signals contains a single driving frequency,
respectively generate a detection matrix according to a detection signal of each column of the sensing elements, and
decode the detection matrices to output a two-dimensional detection vector corresponding to each of the sensing elements;
a substrate;
a first electrode group, a second electrode group and a plurality of ground electrodes arranged at a same level on the substrate, wherein
the first electrode group comprises at least one first electrode formed on the substrate, the at least one first electrode extending along a first direction of the substrate,
the second electrode group comprises a plurality of second electrodes, wherein the plurality of second electrodes are arranged as multiple separated rows, and each of said multiple separated rows includes multiple second electrodes separately arranged along a second direction of the substrate, and
the plurality of ground electrodes are separately formed on the substrate, wherein each of the plurality of ground electrodes is respectively arranged between two adjacent second electrodes in one of said multiple separated rows; and
a plurality of elastic pads each crossing over the at least one first electrode and one of the ground electrodes along the second direction of the substrate to electrically contact the two adjacent second electrodes in one of said multiple separated rows and at two sides of the first electrode crossed thereby, wherein each of the ground electrodes and a corresponding elastic pad is configured to form one of the sensing elements.

16. The touch keyboard as claimed in claim 15, wherein the control chip is configured to encode the drive signal with a Hadamard matrix, and decode the detection matrices with an inverse matrix of the Hadamard matrix.

17. The touch keyboard as claimed in claim 15, wherein the control chip is configured to
modulate the detection signal with two mixing signals to generate a pair of modulated detection signals; and
filter the pair of modulated detection signals to generate the two-dimensional detection vector corresponding to the single driving frequency.

18. The touch keyboard as claimed in claim 15, wherein the control chip is further configured to phase-modulate the encoded drive signals corresponding to each row of the sensing elements to cause the encoded and modulated drive signals corresponding to different rows of the sensing elements to have a phase difference therebetween.

19. The touch keyboard as claimed in claim 15, wherein the driving frequencies corresponding to each row of the sensing elements are identical to or different from one another.

\* \* \* \* \*